(12) United States Patent
Lee et al.

(10) Patent No.: US 6,768,671 B1
(45) Date of Patent: Jul. 27, 2004

(54) NONVOLATILE MEMORY AND METHOD OF OPERATION THEREOF TO CONTROL ERASE DISTURB

(75) Inventors: Poongyeub Lee, San Jose, CA (US); Joo Weon Park, Pleasanton, CA (US); Kwangho Kim, Sunnyvale, CA (US); Eungjoon Park, Fremont, CA (US)

(73) Assignee: NexFlash Technologies, Inc., San Jose, CA (US)

( * ) Notice: Subject to any disclaimer, the term of this patent is extended or adjusted under 35 U.S.C. 154(b) by 0 days.

(21) Appl. No.: 10/382,719

(22) Filed: Mar. 5, 2003

(51) Int. Cl.[7] ............................................. G11C 16/16
(52) U.S. Cl. ........................... 365/185.02; 365/185.23; 365/185.12; 365/185.11; 365/185.33; 365/185.29
(58) Field of Search ...................... 365/185.02, 185.12, 365/185.11, 185.23, 185.33, 185.29, 185.18

(56) References Cited

U.S. PATENT DOCUMENTS

| | | | |
|---|---|---|---|
| 4,571,707 A | * 2/1986 | Watanabe | 365/200 |
| 5,060,195 A | 10/1991 | Gill et al. | 365/185.06 |
| 5,418,741 A | 5/1995 | Gill | 365/185.16 |
| 5,576,987 A | * 11/1996 | Ihara et al. | 365/149 |
| 5,646,886 A | 7/1997 | Brahmbhatt | 365/185.16 |
| 5,659,504 A | 8/1997 | Bude et al. | 365/185.27 |
| 5,959,892 A | 9/1999 | Lin et al. | 365/185.28 |
| 6,175,519 B1 | 1/2001 | Lu et al. | 365/185.02 |
| 6,661,706 B2 | * 12/2003 | Kawai et al. | 365/185.12 |
| 2002/0012280 A1 | 1/2002 | Yamamoto et al. | 365/200 |
| 2002/0167843 A1 | 11/2002 | Hsia et al. | 365/185.28 |
| 2002/0167844 A1 | 11/2002 | Han et al. | 365/185.28 |

OTHER PUBLICATIONS

Ohi et al., "An Asymmetrical Offset Source/Drain Structure for Virtual Ground Array Flash Memory with DINOR Operation," Symposium on VLSI Technology, Digest of Technical Papers, May 17–19, 1993, pp. 57–58.
Brown, William D. and Brewer, Joe E., eds., Nonvolatile Semiconductor Memory Technology: A Comprehensive Guide to Understanding and Using NVSM Devices, IEEE Press, New York, 1998, pp. 69, 105, 107–108, 203, 213–217, 226–227, 235, 239–241, 244, 247, 279–281.

* cited by examiner

Primary Examiner—Andrew Q. Tran
(74) Attorney, Agent, or Firm—Altera Law Group, LLC

(57) ABSTRACT

In an array of nonvolatile memory cells, as many memory cells as desired and indeed even the entire array of memory cells may be placed in a single region of the bulk, illustratively a p-well. Peripheral circuitry is used to in effect section the memory array into blocks and groups of blocks, and to establish suitable biasing and counter-biasing within those blocks and groups during page or block erase operations to limit erase disturb. Each group is provided with its own set of voltage switches, which furnishes the bias voltages for the various modes of operation, including erase. Each of the voltage switches furnish either a large positive voltage when its group is selected, or a large negative voltage when its group is unselected. The size of the group is established as a compromise between degree of erase disturb and substrate area required for the voltage switches.

17 Claims, 16 Drawing Sheets

| FOR U=1 AND VW=1 (WL DEPENDS ON T_1) ||||||||
|---|---|---|---|---|---|---|---|
| MODE | VOLTAGE NODES |||| OUTPUTS || INPUTS ||
|  | AVNN_1 | VPP_1 | VNN_1 | VNN_2 | X8 | X8B | T_1 | WL |
| READ | VCC | VCC | 0V | 0V | VCC | 0V | VR/0V | 0V |
| PROGRAM | VNN_1 | 0V | -12V | 0V | 0V | -12V | -12V/0V | -12V/0V |
| ERASE | VCC | 12V | 0V | 0V | 12V | 0V | 12V/0V | 12V/0V |

Fig. 8A

| FOR U=0 OR V=0 AND W=1 (WL IS 0V) ||||||||
|---|---|---|---|---|---|---|---|
| MODE | VOLTAGE NODES |||| OUTPUTS || INPUTS ||
|  | AVNN_1 | VPP_1 | VNN_1 | VNN_2 | X8 | X8B | T_1 | WL |
| READ | VCC | VCC | 0V | 0V | 0V | VCC | VR/0V | 0V |
| PROGRAM | VNN_1 | 0V | -12V | 0V | -12V | 0V | -12V/0V | 0V |
| ERASE | VCC | 12V | 0V | 0V | 0V | 12V | 12V/0V | 0V |

Fig. 8B

| FOR W=0 ||||||||
|---|---|---|---|---|---|---|---|
| MODE | VOLTAGE NODES |||| OUTPUTS || INPUTS ||
|  | AVNN_1 | VPP_1 | VNN_1 | VNN_2 | X8 | X8B | T_1 | WL |
| READ | VCC | VCC | 0V | 0V | 0V | VCC | VR/0V | 0V |
| PROGRAM | VNN_1 | 0V | -12V | 0V | -12V | 0V | -12V/0V | 0V |
| ERASE | VNN_1 | 0V | -8V | -8V | -8V | 0V | FLOAT | -8V |

Fig. 8C

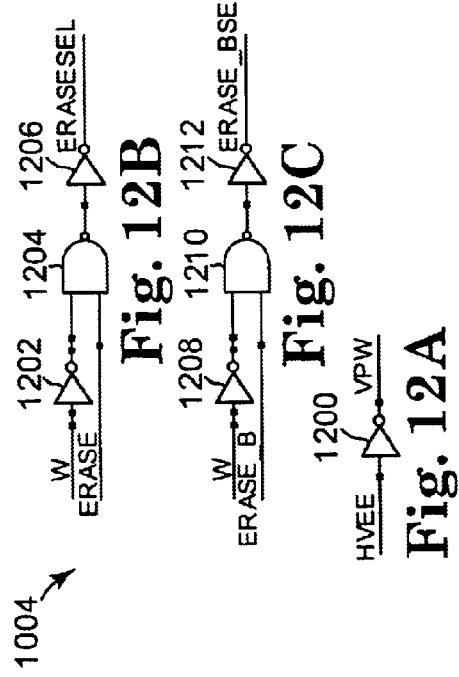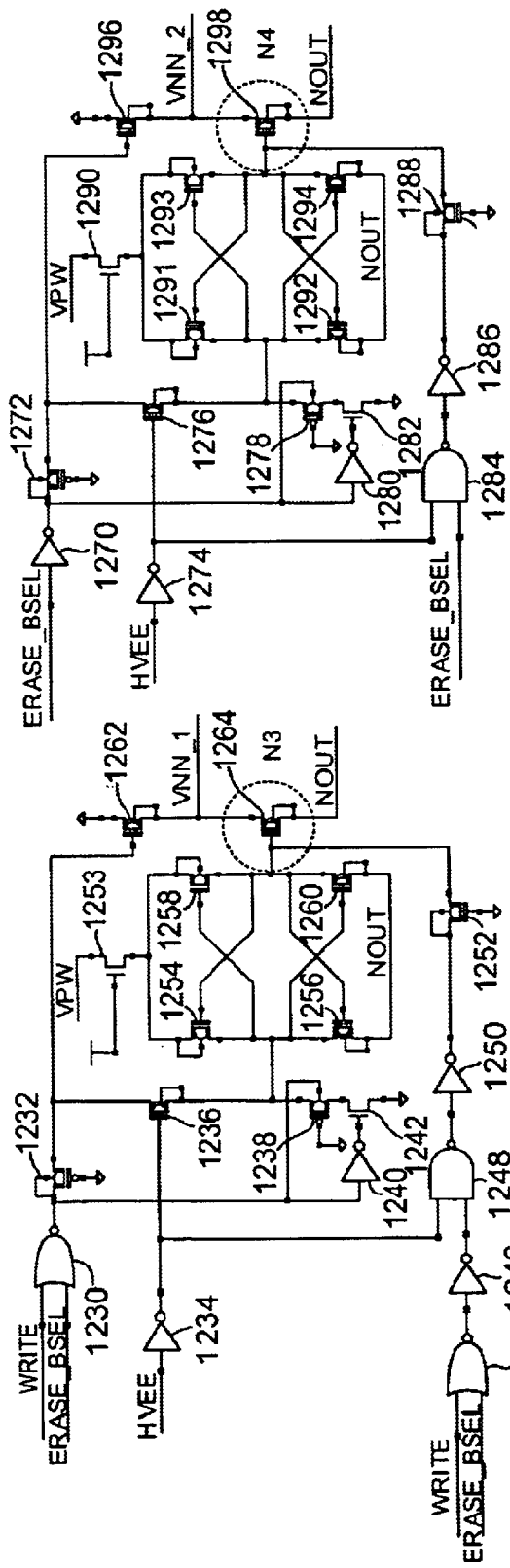
Fig. 12A  Fig. 12B  Fig. 12C  Fig. 12D  Fig. 12E  Fig. 12F

| MODE | VOLTAGE NODES | | | INTERNAL | | I/O | |
|---|---|---|---|---|---|---|---|
| | AVNN | VPP | VNN | X8 | X8B | T | T_1 |
| READ | VCC | VCC | 0V | VCC | 0V | VR/0V | VR/0V |
| PROGRAM | VNN | 0V | -12V | 0V | -12V | -12V/0V | -12V/0V |
| ERASE (W=H) | VCC | 12V | 0V | 12V | 0V | 12V/0V | 12V/0V |
| ERASE (W=L) | VCC | 12V | 0V | 0V | 12V | 12V/0V | F/F |

Fig. 14

| MODE | VOLTAGE NODES | | | | INTERNAL | | OUT |
|---|---|---|---|---|---|---|---|
| | VPN | VPP | VNN | AVNN | X8 | X8B | T |
| READ | VR | VCC | 0V | VCC | VCC | 0V | VR/0V |
| PROGRAM | -12V | 0V | -12V | -12V | 0V | -12V | -12V/0V |
| ERASE | 12V | 12V | 0V | VCC | 12V/0V | 0V/12V | 12V/0V |

Fig. 16

NONVOLATILE MEMORY AND METHOD OF OPERATION THEREOF TO CONTROL ERASE DISTURB

BACKGROUND OF THE INVENTION

1. Field of the Invention

The present invention relates to semiconductor memory, and more particularly to nonvolatile memory and method of operation thereof to control erase disturb.

2. Description of the Related Art

Nonvolatile memory retains stored data when power is removed, which is required or at least highly desirable in many different types of computers and other electronic devices. A variety of different types of nonvolatile semiconductor memory devices are known, include types based on the storage of charge in discrete trapping centers of a dielectric layer of the structure, and types based on the storage of charge on a conducting or semiconducting layer that is completely surrounded by a dielectric, typically an oxide. A common type of stored charge device is the stacked gate transistor, also known as a floating gate transistor, in which cell programming typically is achieved using an electron transport mechanism such as Fowler-Nordheim ("FN") tunneling, channel hot-electron ("CHE") injection, or channel-initiated secondary electron injection ("CISEI") as disclosed in, for example, U.S. Pat. No. 5,659,504 issued Aug. 19, 1997 (Bude et al., "Method and Apparatus for Hot Carrier Injection").

Self-aligned double-polysilicon stacked gate structures have been used in a variety of array architectures, including NAND and NOR architectures and various contactless virtual ground configurations. Examples of virtual ground array architectures and nonvolatile semiconductor memory devices include those disclosed in the following publications: U.S. Pat. No. 6,175,519 issued Jan. 16, 2001 to Liu et al.; U.S. Pat. No. 5,959,892 issued Sep. 28, 1999 to Lin et al.; U.S. Pat. No. 5,646,886 issued Jul. 8, 1997 to Brahmbhatt; U.S. Pat. No. 5,418,741, issued May 23, 1995 to Gill; U.S. Pat. No. 5,060,195 issued Oct. 22, 1991 to Gill et al., and Ohi et al., "An Asymmetrical Offset Source/Drain Structure for Virtual Ground Array Flash Memory with DINOR Operation," Symposium on VLSI Technology, Digest of Technical Papers, May 17–19, 1993, pp. 57–58.

In many array architectures, cells are erased into a high threshold voltage state in groups such as a block or sector (page) using FN tunneling. Unfortunately, in block erase and page erase operations, data cells in the unselected rows are exposed to bias conditions that progressively raise, or disturb, their threshold voltage. These bias conditions can, over a great many such erase cycles, cause data in the memory array to become corrupted. This problem is known as erase disturb.

FIG. 1 is a simplified schematic diagram showing a layout diagram of a typical memory 100 in which isolation structures are used to manage erase disturb. Isolation structures are used to create a number of isolated p-wells 101, 103, 105 and 107 (in practice, many more such swells would be created). Isolation is achieved in the FIG. 1 example by placing the p-wells (such as 101, 103, 105 and 107) into n-wells (such as 102, 104, 106 and 108), which are spaced apart throughout the memory 100. Oxides and other dielectrics may also be used. Having a limited number of blocks within each p-well and isolating the p-wells from one another is an effective technique for reducing this type of erase disturb. Unfortunately, the use of such isolation structures increases the size of the array of memory cells.

BRIEF SUMMARY OF THE INVENTION

What is needed is an erase technique that does not depend on the use of isolation structures to reduce the type of erase disturb that occurs when a large number of blocks are placed within the same bulk region.

We have developed an erase technique that uses peripheral circuitry instead of isolation structures within the array of memory cells to reduce the type of erase disturb that occurs when a large number of blocks are placed within the same bulk region.

This and other advantages are realized individually or collectively in various embodiments of the present invention. One embodiment of the present invention is a nonvolatile semiconductor memory array integrated circuit comprising an array of nonvolatile memory cells generally organized in a plurality of pages, each page being accessible by a word line and the bits therein being accessible by bit lines; an address input; and an X-decoder having an input coupled to the address input and an output coupled to the word lines of the nonvolatile memory cell array. The output of the X-decoder logically sections the memory cell array into a plurality of groups of blocks of pages, and the X-decoder being responsive to an address on the address input during erase mode for selecting one of the groups and one of the blocks within the selected group and for applying a first voltage to at least one page of the selected block in the selected group for erasing the memory cells thereof, a second voltage to the pages of the selected group other than the selected at least one page to avoid erasing the memory cells thereof, and a third voltage to the pages of the groups other than the selected group to avoid disturb of the memory cells thereof.

Another embodiment of the present invention is a nonvolatile semiconductor memory array integrated circuit comprising an array of nonvolatile memory cells generally organized in a plurality of blocks having a plurality of pages, each block being selectable by a block select line and each page being selectable by a word line; a plurality of X-decoder group circuits, each having a plurality of block select outputs and word line outputs coupled to a group of the block select lines and word lines of the memory cell array; a plurality of voltage switches respectively coupled to the X-decoder group circuits by respective first and second voltage outputs; and a pre-decoder having an X-address input, global group select outputs, global block select outputs, and global page select outputs. The X-decoder group circuits are respectively coupled to the global group select outputs of the pre-decoder, and each of the X-decoder group circuits is coupled to the global block select outputs of the pre-decoder. The voltage switches are respectively coupled to the global group select outputs of the pre-decoder for furnishing a large positive potential on the first voltage output and a ground potential on the second voltage output for a selected group, and for furnishing a ground potential on the first voltage output and a large negative potential on the second voltage output for an unselected group.

Another embodiment of the present invention is a method for operating a nonvolatile semiconductor memory array integrated circuit in a block erase mode, the memory array having an array of nonvolatile memory cells generally organized in a plurality of pages, with each page being accessible by a word line and the bits therein being accessible by bit lines. The method comprises logically sectioning the memory cell array into a plurality of groups of blocks of pages; selecting one of the groups and one of the blocks within the selected group in accordance with a portion of an X memory address; applying a first voltage on the pages in the selected block of the selected group for erasing the memory cells thereof; applying a second voltage on the pages in unselected blocks of the selected group to avoid erasing the memory cells thereof; and applying a third voltage on the pages in the groups other than the selected group to avoid disturb of the memory cells thereof.

Another embodiment of the present invention is a method for operating a nonvolatile semiconductor memory array integrated circuit in a page erase mode, the memory array having an array of nonvolatile memory cells generally organized in a plurality of pages, with each page being accessible by a word line and the bits therein being accessible by bit lines. The method comprises logically sectioning the memory cell array into a plurality of groups of blocks of pages; selecting one of the groups and one of the blocks within the selected group in accordance with a first portion of an X memory address; selecting one of the pages within the selected block of the selected group in accordance with a second portion of the X memory address; applying a first voltage on the selected page of the selected block of the selected group for erasing the memory cells thereof; applying a second voltage on unselected pages of the selected block of the selected group for erasing the memory cells thereof; applying the second voltage on the pages in unselected blocks of the selected group to avoid erasing the memory cells thereof; and applying a third voltage on the pages in the groups other than the selected group to avoid disturb of the memory cells thereof.

BRIEF DESCRIPTION OF THE SEVERAL VIEWS OF THE DRAWINGS

FIG. 8A is a table of X-decoder bias condition for U=1 and VW=1, which corresponds to a selected block within a selected group.

FIG. 8B is a table of X-decoder bias condition for U=0 or V=0, and W=1, which corresponds to an unselected block within a selected group.

FIG. 8C is a table of X-decoder bias condition for W=0, which corresponds to an unselected group.

FIG. 12, which consists of FIGS. 12A, 12B, 12C, 12D, 12E and 12F, is a detailed schematic circuit diagram of the VNNSWIT_3 voltage switches of FIG. 10.

FIG. 14 is a table of bias conditions for the TDECSW voltage generator of FIG. 13.

FIG. 16 is a table of bias conditions for the TDEC pre-decode circuit of FIG. 15.

DETAILED DESCRIPTION OF THE INVENTION, INCLUDING THE BEST MODE

Figure 2:
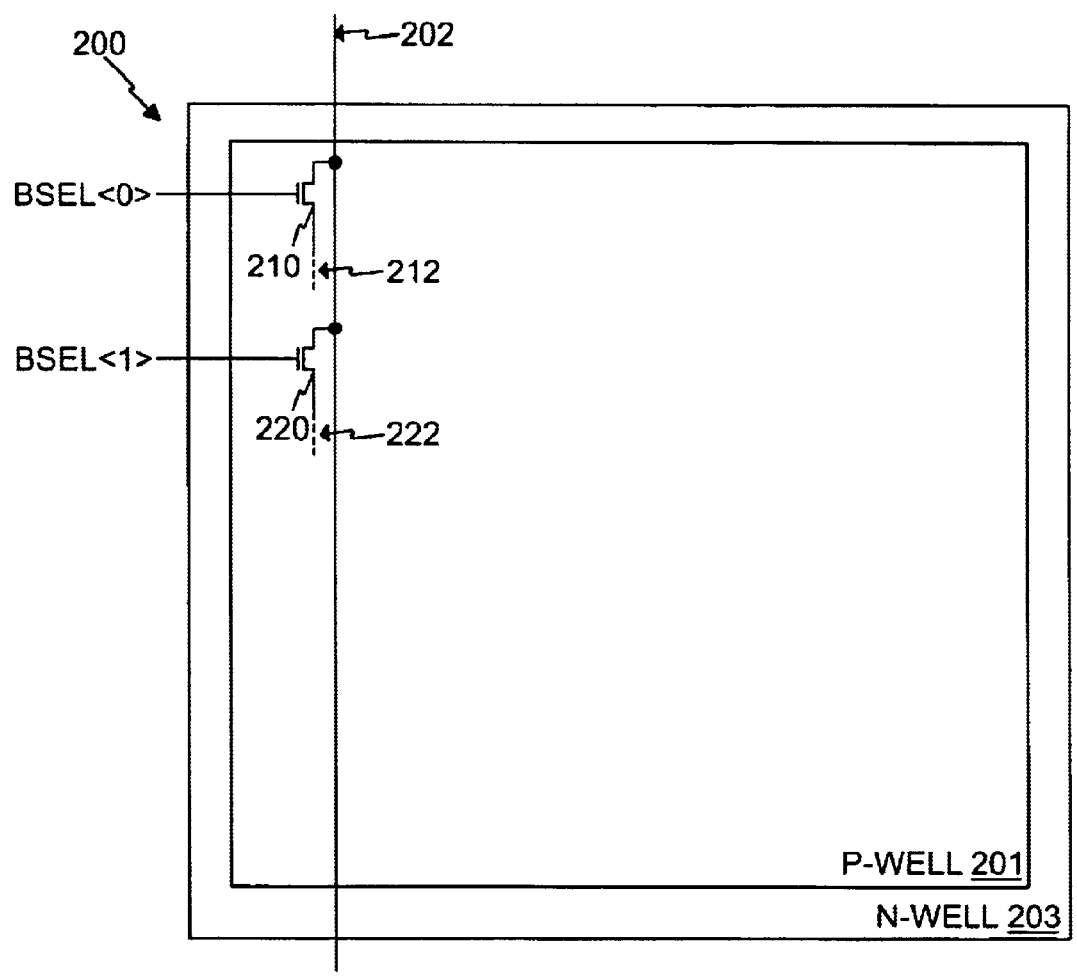
FIG. 2 is a simplified schematic diagram showing various elements of a memory array.
Figure 3:
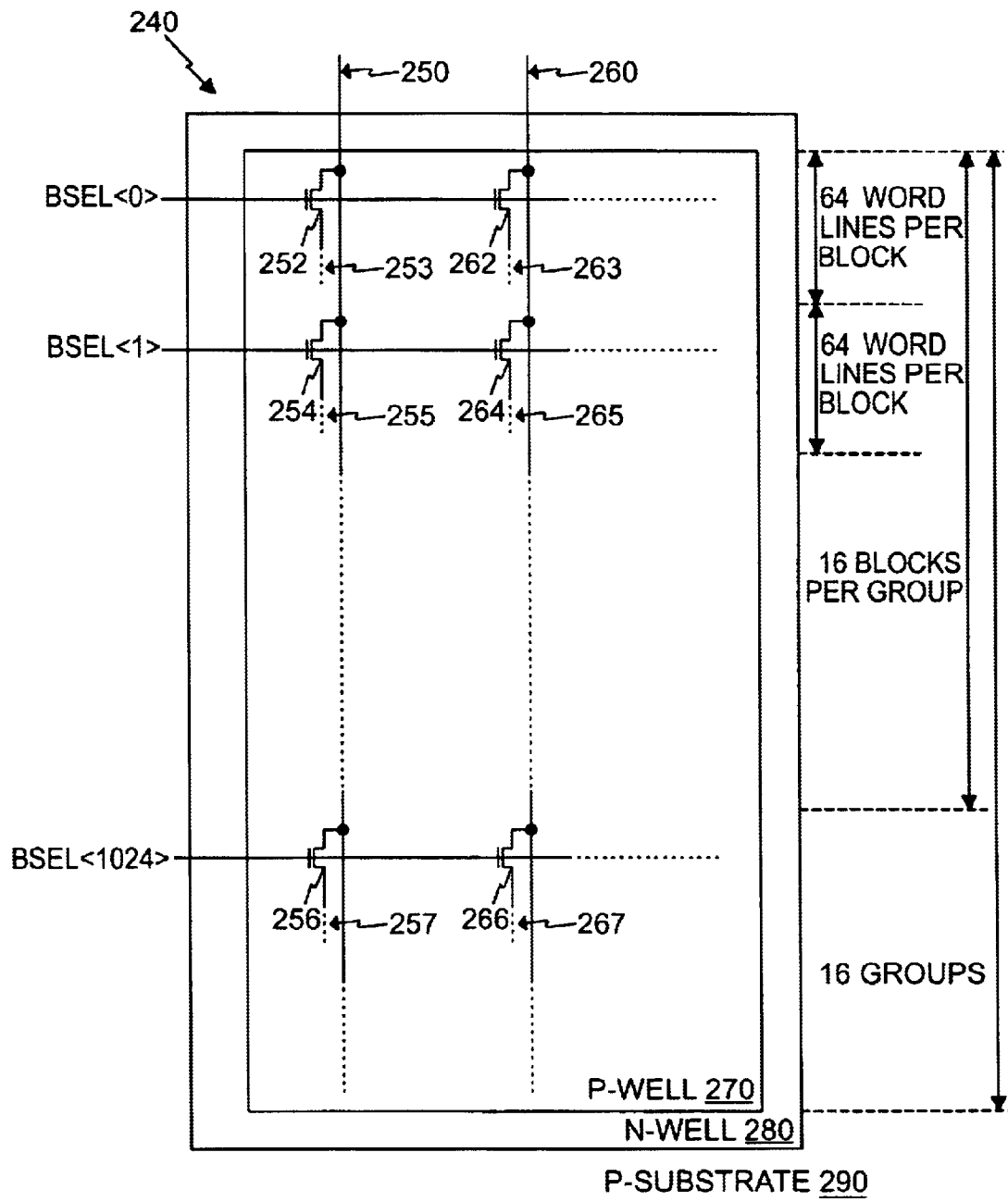
FIG. 3 is a simplified schematic diagram showing various elements of a memory array grouped in accordance with the present invention.

In an array of nonvolatile memory cells, as many memory cells as desired and indeed even the entire array of memory cells may be placed in a single region of the bulk, illustratively a p-well as shown in FIGS. 2 and 3. Peripheral circuitry is used as shown in FIG. 3 to establish suitable biasing and counter-biasing throughout the entire array of memory cells to limit erase disturb during either page erase or block erase.

Figure 1:
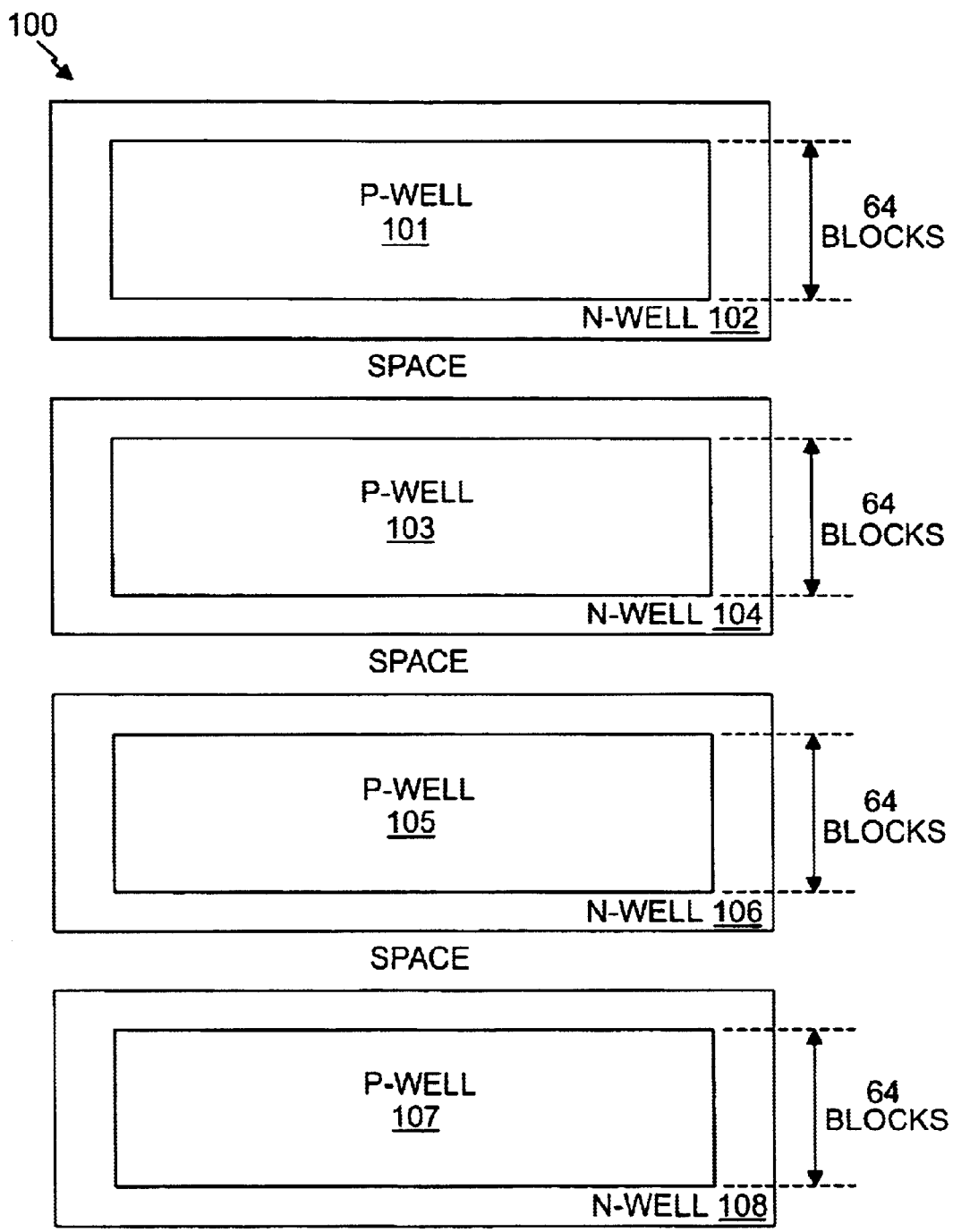
FIG. 1 is a simplified block diagram showing a typical memory array of the prior art.

The memory cell array 200 shown in FIG. 2 is advantageous in that the entire substrate within the memory array is active area used for the array of memory cells, so that the array of memory cells is extremely dense and none of the substrate area is lost to isolation structures such as shown in FIG. 1. However, a serious erase disturb problem arises when too many blocks of memory cells share the same active area. As illustratively shown in FIG. 2, all of the memory cells reside within the same p-well 201, and each column of memory cells within a block resides on a sub-bitline that is controlled by a select transistor. Select transistors 210 and 220, for example, controllably connect their respective sub-bitlines and column transistors, represented by reference numerals 212 and 222 respectively, to bit line 202. Assume that a block of memory controlled by block select signal BSEL<0> is selected to be erased. The p-well 201 is biased at minus 8 volts, the bit lines in the block, including bit line 202, are biased at minus 8 volts, the signal BSEL<0> is brought to zero volts so that all of the select transistors in the block including select transistor 210 are on and their respective sub-bitlines are brought to minus 8 volts, and the word lines in the block are brought to 12 volts so that the entire block of memory cells is erased by FN tunneling of electrons from the source, drain and p-well into the floating gate of the memory cells. The select transistors in other blocks, such as select transistor 220, are biased off so that the bit lines such as 222 float, and the word lines within those blocks are brought to zero volts to prevent erasure of the memory cells in those other blocks. Unfortunately, the memory cells in the other blocks are in the same p-well as the block being erased and are exposed to the p-well potential of minus 8 volts, which couples a substantial voltage on the order of minus 6.95 volts, for example, to the source and drain. Over a number of erase cycles, the cells that are programmed, that is those having a low threshold voltage, will experience a disruptive degree of erase disturb due to tunneling of electrons into their floating gates.

FIG. 3 shows an illustrative sectioning of a memory array 240 into blocks and groups which when accessed with suitable peripheral circuitry, allows suitable counter-biasing throughout the entire array of memory cells to limit erase disturb. All of the memory cells of the array 240 reside in a common p-well 270, which is within an n-well 280 in a p-substrate 290. Each column of memory cells within a block resides on a sub-bitline that is controlled by a select transistor; for example, select transistors 252, 254 and 256 controllably connect their respective sub-bitlines and sub-bit line transistors 253, 255 and 257 to bit line 250, and select transistors 262, 264 and 266 controllably connect their respective sub-bitlines and sub-bit line transistors 263, 265 and 267 to bit line 260. The array of 16,384 pages is sectioned into 16 groups, each group having 16 blocks, and each block having 64 word lines. Blocks 0 and 1, which are selected by block select signals BSEL<0> and BSEL<1>, are in the first group. Block 16, which is selected by block select signal BSEL<16>, is the first block of the second group.

Advantageously, each group is provided with its own set of voltage switches, which furnishes the bias voltages for the various modes of operation, including page erase and block erase. Each of the voltage switches furnish either a large positive voltage when its group is selected, or a large negative voltage when its group is unselected, but does not furnish both a large positive voltage and a large negative voltage. Advantageously, this approach permits a smaller chip size for the voltage switches and a simplified X-decoder design with fewer interconnections. Advantageously, the size of the group is established as a compromise between degree of erase disturb and substrate area required for the voltage switches. A smaller group size produces less erase disturb but requires more voltage switches. A larger group size uses fewer voltage switches but results in more erase disturb. If page erase is not permitted, the group size may be made larger. Hence, an acceptable group size is one that results in a desired compromise between the factors of overall memory density, which includes peripheral circuits such as the voltage switches as well as the memory array, and degree of erase disturb.

In the description that follows, reference is made to a specific embodiment that includes a virtual ground memory array, its associated X-decoder and voltage circuits, and a particular set of bias conditions. However, it is to be understood that this embodiment is illustrative and non-limiting.

An illustrative set of counter-bias voltages and resulting "gate minus source/drain" voltages for the array 240 are shown in Table 1, for a single transistor memory cell having floating gate overlap between at least the source and the floating gate. Assume that the block of memory controlled by block select signal BSEL<0>, which is in the first group, is selected to be erased. The first group would be considered to be the selected group (the other groups would be considered to be unselected), Block 0 would be considered to be the selected block, and Block 1 through Block 15 would be considered to be unselected blocks within the selected group. Example 1 of Table 1 shows bias conditions for the blocks in the unselected groups, and Examples 2 and 3 of Table 1 show bias conditions for the unselected blocks in the selected group.

Consider first the bias conditions on the selected block, which is in the selected group. As shown in Example 4 of Table 1, the p-well 270 is biased at $V_{NSUB}$, illustratively minus 8 volts, the bit lines 250 and 260 are biased at $V_{NSUB}$ or minus 8 volts, the signal BSEL<0> is brought to zero volts so that all of the select transistors in the block including select transistor 252 and 262 are on and their respective sub-bitlines 253 and 263 are brought to minus 8 volts, and the word lines in the block are brought to 12 volts so that the entire block of memory cells is erased by FN tunneling of electrons from the source, drain and p-well into the floating gate of the memory cells.

In the unselected blocks of the unselected groups, the word lines are counter-biased at $V_{NSUB}$ or minus 8 volts and the select transistors such as select transistor 256 and 266, may be biased on or off These counter-biasing conditions are shown in Example 2 and Example 3 respectively of Table 1. If these select transistors are biased on so that their respective sub-bitlines 257 and 267 are brought to minus 8 volts, which is Example 3 in Table 1, not only are the memory cells not erased but they have no disturb because the gate-source voltage difference $V_G-V_S$ and the gate-drain voltage difference $V_G-V_D$ are both zero. If these select transistors are biased off so that their respective sub-bitlines 257 and 267 float, which is Example 2 in Table 1, once again not only are the memory cells not erased but they have little or no disturb because the gate-source voltage difference $V_G-V_S$ and the gate-drain voltage difference $V_G-V_D$ are both merely minus 0.64 volts.

In the unselected blocks of the selected group, the word lines arc counter-biased at 0 volts and the select transistors such as select transistor 254 and 264 are biased off These counter-biasing conditions are shown as Example 1 in Table 1. The select transistors are off in the unselected blocks of the selected group, so that their sub-bitlines float. However, since the p-well is biased at minus 8 volts, the floating sub-bitlines acquire a charge of about minus 6.95 volts so that the gate-source voltage difference $V_G-V_S$ and the gate-drain voltage difference $V_G-V_D$ are 6.95 volts, which is sufficient to disturb programmed memory cells. Even so, the erase disturb is limited to the cells of the unselected blocks in the selected group. When blocks in other groups are being erased, the blocks in the previously selected group experience essentially no erase disturb. Hence, the memory cells do not experience the excessive degree of erase disturb discussed in the context of FIG. 2. Rather, the degree of erase disturb is comparable to the degree achieved in the FIG. 1 memory, but without the loss of memory array density due to the isolation structures required in the FIG. 1 memory.

TABLE 1

| CONDITION | INITIAL VOLTAGES | | | VOLTAGES DURING ERASE | | | |
|---|---|---|---|---|---|---|---|
| | $V_G$ | $V_S$; $V_D$ | $V_{NSUB}$ | $V_G$ | $V_S$; $V_D$ | $V_{NSUB}$ | $V_G-V_S$; $V_G-V_D$ |
| EXAMPLE 1 Counter-bias with source and drain floating, for | 0V | 0V | 0V | 0V | −6.95V (F) | −8V | 6.95V |

TABLE 1-continued

| | INITIAL VOLTAGES | | | VOLTAGES DURING ERASE | | | |
|---|---|---|---|---|---|---|---|
| CONDITION | $V_G$ | $V_S$; $V_D$ | $V_{NSUB}$ | $V_G$ | $V_S$; $V_D$ | $V_{NSUB}$ | $V_G-V_S$; $V_G-V_D$ |
| unselected blocks of selected group | | | | | | | |
| EXAMPLE 2 Counter-bias with source & drain floating, for unselected groups | 0V | 0V | 0V | −8V | −7.36V (F) | −8V | −0.64V |
| EXAMPLE 3 Counter-bias with source drain having the same voltage as $V_{NSUB}$, for unselected groups | 0V | 0V | 0V | −8V | −8V | −8V | 0V |
| EXAMPLE 4 Erase biasing for selected block | 0V | 0V | 0V | 12V | −8V | −8V | 20V |

Figure 4:
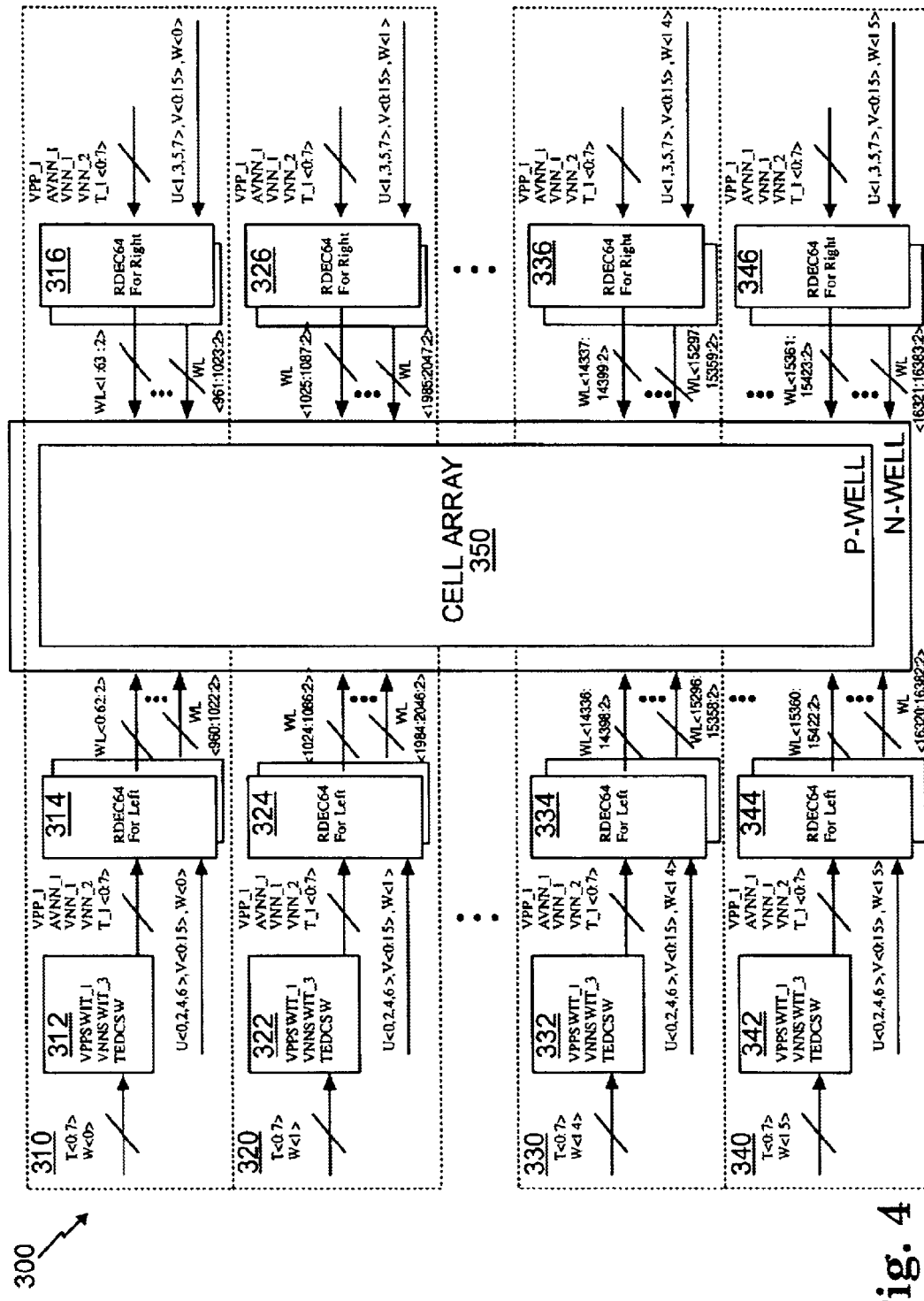
FIG. 4 is a detailed block diagram of an X-decoder in accordance with the present invention.

FIG. 4 is a block schematic diagram showing an X-decoder architecture 300 for implementing the counter-biasing technique of Table 1. The X-decoder architecture 300 is combined with various other circuits to create, for example, a nonvolatile memory integrated circuit. These other circuits include address and data buffers, column decoders, sense amplifiers, voltage pump circuits, and memory control circuits. While some of these circuits are well known in the art, others are realized in the manner described below.

For purposes of explanation and not limitation, the memory cell array 350 has 4225 bit lines ("BL"), 528 bytes of memory per page, and 16384 pages. The X-decoder architecture 300 groups the 16384 pages into 256 blocks, which is 64 pages per block. Each column of memory cells within a block resides on a sub-bitline that is controlled by a select transistor (block select lines omitted for clarity). The X-decoder architecture 300 further groups the 256 blocks into 16 groups of 16 blocks each, to manage erase disturb to an acceptable level, as described in the context of FIG. 3. The first group 310, for example, is selected by W<0> and has 16 decoder circuits 314, each of which decodes signals T_1<0:7> and U<0,2,4,6> for selecting one of 32 word lines from the left side of the array 350, as well as 16 decoder circuits 316, each of which decodes signals T_1<0:7> and U<1,3,5,7> for selecting one of 32 word lines from the right side of the array 350. The first of the decoder circuits 314 is selected by signal V<0> and selects among word lines WL<0:62:2>, and the first of the decoder circuits 316 is selected by signal V<0> and selects among word lines WL<1:63:2>. The sixteenth of the decoder circuits 314 is selected by signal V<15> and selects among word lines WL<960:1022:2>, and the sixteenth of the decoder circuits 316 is selected by signal V<15> and selects among word lines WL<961:1023:2>. Similarly, the second group 320 is selected by W<1> and has 16 decoder circuits 324, each of which decodes signals T_1<0:7> and U<0,2,4,6> for selecting one of 32 word lines from the left side of the array 350, as well as 16 decoder circuits 326, each of which decodes signals T_1<0:7> and U<1,3,5,7> for selecting one of 32 word lines from the right side of the array 350. The first of the decoder circuits 324 is selected by signal V<0> and selects among word lines WL<1024:1086:2>, and the first of the decoder circuits 326 is selected by signal V<0> and selects among word lines WL<1025:1087:2>. The sixteenth of the decoder circuits 324 is selected by signal V<15> and selects among word lines WL<1984:2046:2>, and the sixteenth of the decoder circuits 326 is selected by signal V<15> and selects among word lines WL<1985:2047:2>. Similarly, the fifteenth group 330 is selected by W<14> and has 16 decoder circuits 334, each of which decodes signals T_1<0:7> and U<0,2,4,6> for selecting one of 32 word lines from the left side of the array 350, as well as 16 decoder circuits 336, each of which decodes signals T_1<0:7> and U<1,3,5,7> for selecting one of 32 word lines from the right side of the array 350. The first of the decoder circuits 334 is selected by signal V<0> and selects among word lines WL<14336:14398:2>, and the first of the decoder circuits 336 is selected by signal V<0> and selects among word lines WL<14337:14399:2>. The sixteenth of the decoder circuits 334 is selected by signal V<15> and selects among word lines WL<15296:15358:2>, and the sixteenth of the decoder circuits 336 is selected by signal V<15> and selects among word lines WL<15297:15359:2>. Similarly, the sixteenth group 340 is selected by W<15> and has 16 decoder circuits 344, each of which decodes signals T_1<0:7> and U<0,2,4,6> for selecting one of 32 word lines from the left side of the array 350, as well as 16 decoder circuits 346, each of which decodes signals T_1<0:7> and U<1,3,5,7> for selecting one of 32 word lines from the right side of the array 350. The first of the decoder circuits 344 is selected by signal V<0> and selects among word lines WL<15360:15422:2>, and the first of the decoder circuits 346 is selected by signal V<0> and selects among word lines WL<15361:15423:2>. The sixteenth of the decoder circuits 344 is selected by signal V<15> and selects among word lines WL<16320:16382:2>, and the sixteenth of the decoder circuits 346 is selected by signal V<15> and selects among word lines WL<16321:16383:2>.

Each of the groups has its own set of voltage switches. Group 310, for example, includes voltage switches 312 for furnishing voltages $V_{PP\_1}$, $AV_{NN\_1}$, $V_{NN\_1}$, $V_{NN\_2}$ and T_1<0:7> to the various decoder circuits 314 and 316 in the group 310. Similarly, group 320 includes voltage switches 322 for furnishing voltages $V_{PP\_1}$, $AV_{NN\_1}$, $V_{NN\_1}$, $V_{NN\_2}$ and T_1<0:7> to the various decoder circuits 324 and 326 in the group 320; group 330 includes voltage switches 332 for furnishing voltages $V_{PP\_1}$, $AV_{NN\_1}$, $V_{NN\_1}$, $V_{NN\_2}$ and T_1<0:7> to the various decoder circuits 334 and 336 in the group 330; and group 340 includes voltage switches 342 for furnishing voltages $V_{PP_{13}\_1}$, $AV_{NN\_1}$, $V_{NN\_1}$, $V_{NN\_2}$ and T_1<0:7> to the various decoder circuits 344 and 346 in the group 340.

The X-decoder architecture 300 operates in the following general and illustrative manner. A fourteen bit X-address A<0:13> is pre-decoded in any suitable decoder circuits (not shown), including conventional circuits, to produce global signals T<0:7>, U<0:7>, V<0:15> and W<0:15> from, respectively, A<1:3>, A<0,4,5>, A<6:9> and A<10:13>. Global signal W selects one of the sixteen groups of blocks. Global signal V selects one of the 16 blocks within a group. Global signals T and U select one of 64 word lines within a block.

Figure 5:
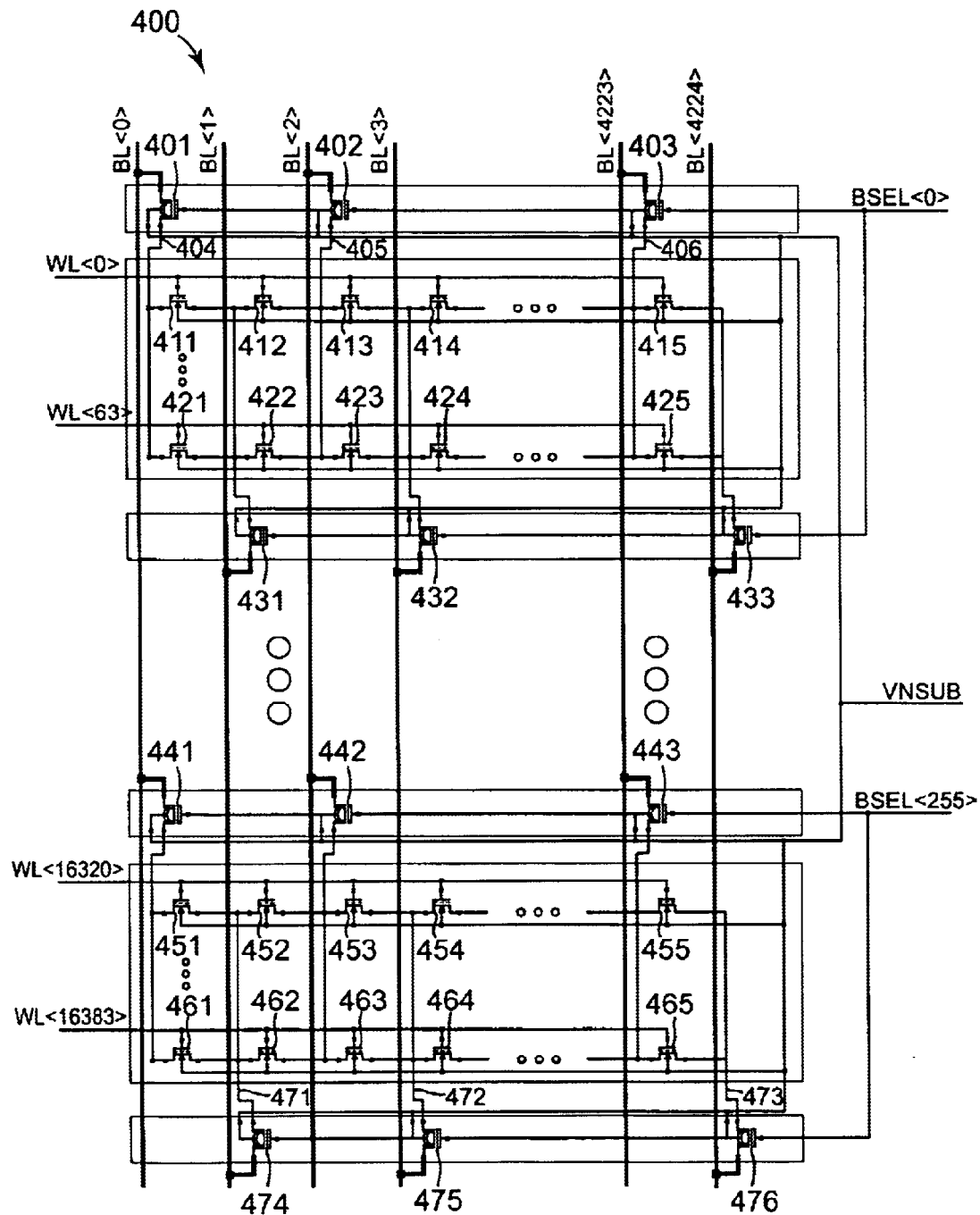
FIG. 5 is a detailed schematic diagram of an illustrative virtual ground memory array useful with the X-decoder of FIG. 4.

FIG. 5 is a schematic diagram that shows in detail a section 400 of an illustrative virtual ground memory array that is useful as the cell array 350 of FIG. 4. The memory cells of the array 400 preferably are single transistor floating gate memory cells organized in rows and columns and interconnected by row lines and column lines. Row lines, which serve as word lines, may be fabricated with a variety of materials, one example of which is WSi$_2$/Poly. The row accessed by word line WL<0> includes memory cells 411, 412, 413, 414 and 415; the row accessed by word line WL<63> includes memory cells 421, 422, 423, 424 and 425; the row accessed byword line WL<16320> includes memory cells 451, 452, 453, 454 and 455; and the row accessed by word line WL<16383> includes memory cells 461, 462, 463, 464 and 465. The columns generally lie between bit lines such as BL<0>, BL<1>, BL<2>, BL<3>, BL<4223> and BL<4224> and are accessed by sub-bitlines that include sub-bitlines 404, 405, 406, 471, 472 and 473. While bit lines and sub-bitlines may be fabricated with a variety of materials, preferably the bit lines are fabricated from a highly conductive material such as metal used for interconnection lines, while the sub-bitlines are fabricated using an n$^+$ diffusion that forms a buried conductor. Contact between the bit lines and the buried sub-bit lines is made periodically, for example every sixty-fourth word line, to reduce sub-bitline resistance. Due to elimination of the common ground line and the drain contact in each memory cell, extremely small cell size is realized. Due to elimination of all block isolation structures, the overall memory array density is extremely high. The total memory may be of any convenient size, the sizes 64 Mb, 128 Mb, and 256 Mb being illustrative. As a specific example for purposes of illustration, FIG. 5 shows 528 bytes per page and 16,384 pages for a total memory size of 64 Mb.

Figure 6:
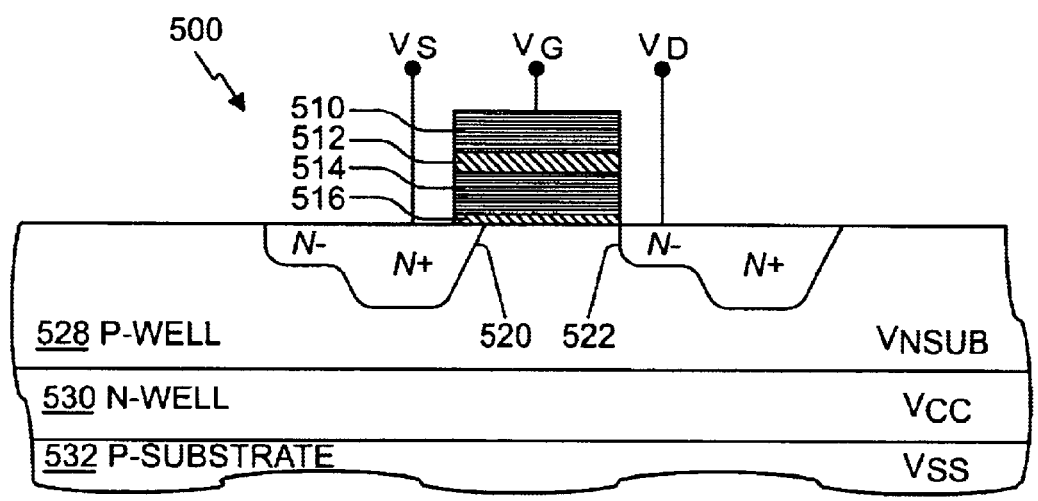
FIG. 6 is a cross-sectional drawing of an illustrative double-polysilicon stacked gate structure suitable for the virtual ground memory of FIG. 5.

FIG. 6 shows an illustrative self-aligned double-polysilicon stacked gate structure 500, although any type of memory cell suitable for use in a virtual ground array may be used. A floating gate 514, typically a doped polysilicon layer, is sandwiched between two insulator layers 512 and 516, typically oxide. The top layer of the stack is a control gate electrode 510, typically a doped polysilicon layer. The stacked gate structure is shown symmetrically overlying a doped n+ source region 520 and a doped n− drain region 522, as well as a channel region between the source region 520 and the drain region 522. The channel region, the source region 520, and the drain region 522 are within a p-well 528, which is contained within an n-well 530, which in turn is contained in a p-type substrate 532. While the memory cell 500 is an asymmetrical transistor, either symmetrical or asymmetrical transistors may be used as desired.

Erasure of the memory cell 500 is performed using Fowler-Nordheim ("FN") tunneling, preferably either a bulk erase in which the voltage applied to the gate 510 is negative and the p-well 528 voltage is positive (for example, −8 volts and +12 volts respectively), or a channel erase in which the voltage applied to the gate 510 is positive and the voltages applied to the source 520, the drain 522, and the p-well 528 are negative (for example, +12 volts and −8 volts respectively).

Programming of the memory cell 500 may be performed by any desired mechanism, including channel hot electron ("CHE") injection, channel-initiated secondary electron injection ("CISEI"), and Fowler-Nordheim ("FN") tunneling. Where FN tunneling is used, for example, a negative potential of about −10 volts may be applied to the control gate while a positive potential of +5 volts may be applied to the source. Tunneling occurs from the floating gate 514 to the source 520 at the overlap region of the control gate 510 and the source 520. The drain is permitted to float. The state of the memory cell 500 may be read using any suitable technique, examples of which are well known in the art. Illustrative programming and read techniques are described in U.S. patent application Ser. No. 10/035,414 filed Nov. 8, 2001 (Hsia et al., Method and apparatus for multiple byte or page mode programming and reading of a flash memory array, and in U.S. patent application Ser. No. 10/039,518 filed Nov. 8, 2001 (Han et al., Method and apparatus for multiple byte or page mode programming and reading and for erasing of a flash memory array, which hereby are incorporated herein in their entirety by reference thereto. Examples of suitable circuits for sensing the values stored in the memory cells are disclosed in United States Patent Application Publication No. U.S. 2002/0012280 published Jan. 31, 2002 (Yamamoto et al., Nonvolatile Semiconductor Storage Device), which hereby is incorporated herein in its entirety by reference thereto.

Detailed operation of the X-decoder architecture 300 during erase may be understood with reference to FIG. 4 and FIG. 5 together. Assume that Block 0 addressed on WL<0:63> of the group 310 is selected to be erased. The bit lines BL<0> through BL<4224> (see FIG. 5) are brought to minus 8 volts, the block select signal BSEL<0> (which corresponds to the global signals V<0> and W<0>) is brought to zero volts so that all of the select transistors in block B<0> (including 401, 402 and 403) are on and their respective sub-bitlines are brought to minus 8 volts, and the word lines WL<0:63> are brought to 12 volts so that the entire block of memory cells is erased. The other word lines WL<64:1023> in all other blocks of the group 310 are brought to zero volts to prevent erasure of their memory cells. Additionally, the block select signals BSEL<1:15> (which correspond to the global signals V<1:15> and W<0>) also are brought to minus 8 volts so that all of the select transistors in blocks B<1> through B<15> in the group 201 (including 232, 234, 236 and 238) are off and their respective sub-bitlines are permitted to float. The cells controlled by the unselected word lines WL<64:1023> experience a degree of erase disturb due to tunneling of electrons into those cells that are programmed, i.e. that have a low threshold voltage. Even though these sub-bitlines are floating, they acquire a charge that varies between minus 6 volts and minus 7 volts. This charge is sufficient to cause a degree of erase disturb.

Advantageously, the memory cells in the other groups such as 320, 330 and 340 experience essentially no erase disturb when operated as follows. The block signals BSEL<16:255> (which correspond to the global signals V<0:15> and W<1:15>) are brought to minus 8 volts so that all of the select transistors in blocks B<16:255> are off and their respective sub-bitlines float. Alternatively, the signals BSEL<16:255> may be brought to zero volts so that all of the select transistors in blocks B<16:255> are on and their respective sub-bitlines are brought to minus 8 volts. The word lines WL<1024:16383> are brought to the negative substrate bias of minus 8 volts. As a result, each of the memory cells in the unselected groups such as 320, 330 and 340 have a control gate potential of minus 8 volts that is equal to or very nearly equal to the source and drain voltage, the difference being 0.64 volts or 0 volts depending on the whether the sub-bitlines are floated or have the same voltage as the negative bias. As a result, no tunneling into the floating gate can occur to disturb the threshold voltage of these memory cells.

While the cells of the unselected block in the selected group experience erase disturb, this erase disturb is distributed across the entire memory array over time as the group containing the selected block changes, so that the cumulative impact of the erase disturb on the memory array is as much as one sixteenth of what it otherwise might be.

Figure 7:
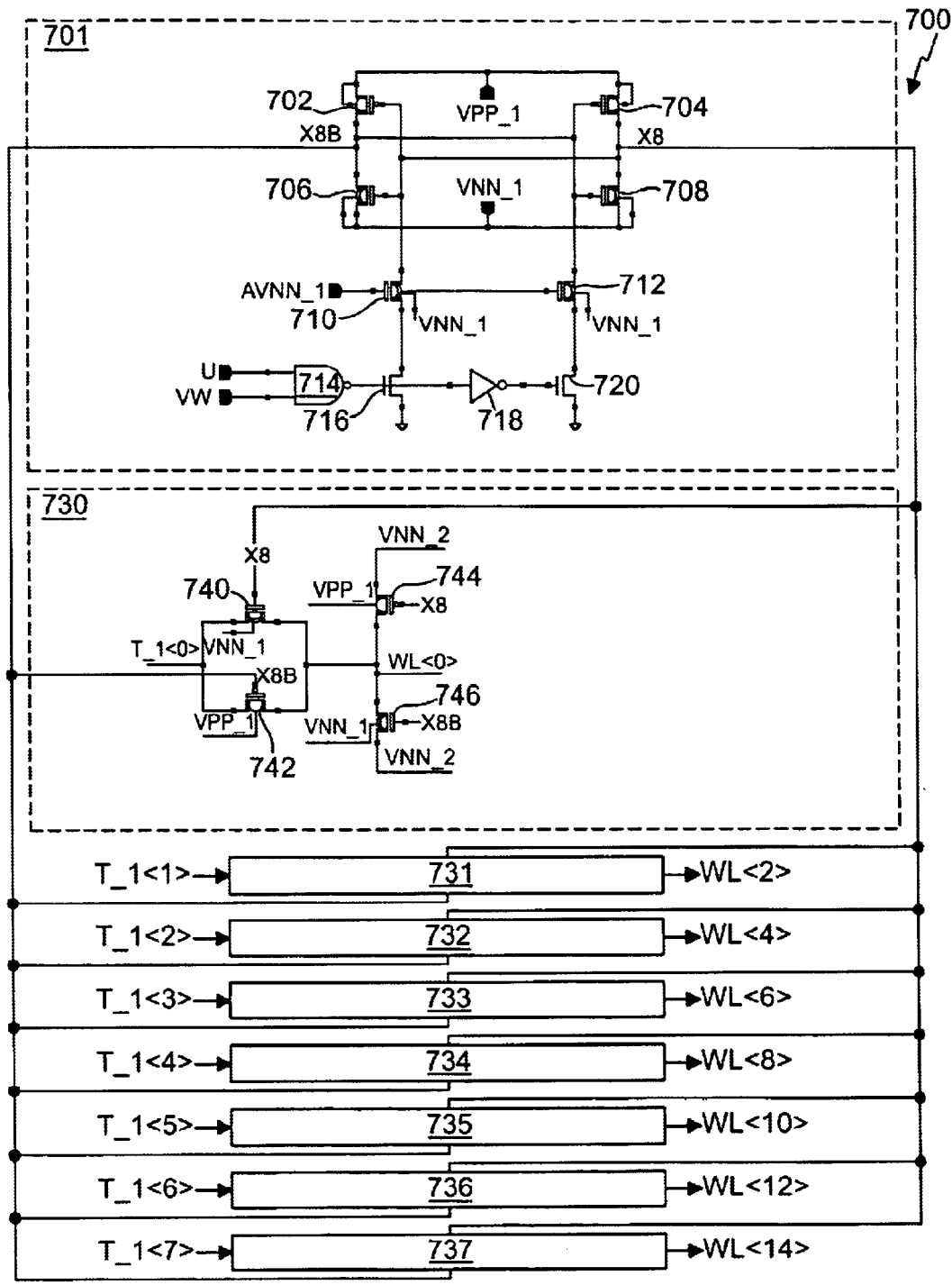
FIG. 7 is a schematic circuit diagram of an 8 page X-decoder circuit that is useful for providing suitable bias voltages to the memory array of FIG. 5 when using the stacked gate transistor structure of FIG. 6.

FIG. 7 is a schematic circuit diagram of an 8 page X-decoder circuit 700 that is useful for providing suitable bias voltages to the memory array 400 from the select signals W, V, U and T during a word erase cycle. The circuit 700 includes a NAND gate 714 that receives the select signal U and a signal VW that is the AND of V and W, and applies the output to a latch 701 for setting the state thereof through either transistor 716 or transistor 720 via an inverter 718. One branch of the latch 701 includes p-channel transistor 702 and n-channel transistor 706, and the other branch of the latch 701 includes p-channel transistor 704 and n-channel transistor 708. The voltage $V_{PP\_1}$ is applied to the p-channel transistors 702 and 704, which also have their substrates tied to $V_{PP\_1}$. The voltage $V_{NN\_1}$ is applied to the n-channel transistors 706 and 708, which also have their substrates tied to $V_{NN\_1}$. The latch 701 is enabled by signal $A_{VNN\_1}$ applied to transistors 710 and 712, both of which have their substrates tied to voltage $V_{NN\_1}$.

The outputs X8 and X8B of the latch 701 respectively assume the voltages $V_{PP\_1}$ and $V_{NN\_1}$ or $V_{NN\_1}$ and $V_{PP\_1}$ depending on the value of U, V and W, as shown in the Table of FIGS. 8A, 8B and 8C. The outputs X8 and X8B are applied to 8 essentially identical circuits 730–737, which are used to drive respective word lines WL<0:14:2> in accordance with the values T_1<0:7>. In the illustrative circuit 730, which is shown in detail, the output X8 is applied to n-channel transistor 740 and the output X8B is applied to p-channel transistor 742. The value T_1<0> may or may not be passed through to WL<0>, depending on the outputs X8 and X8B. If the value T_1<0> is not passed through, advantageously WL<0> is driven to VNN_2 (minus 8 volts for an unselected group) through p-channel transistor 744 and n-channel transistor 746.

FIG. 8A shows the X-decoder 700 bias condition for U=1 and VW=1, which corresponds to a selected block within a selected group. WL depends on the value of T_1<#>. During the erase mode, if T_1<#> is 12 volts indicating a selected word line, then WL assumes the value of 12 volts, but if T_1<#> is 0 volts indicating an unselected word line (thereby permitting only a page erase if desired), then WL assumes the value of 0 volts. Bias conditions for the read and program modes are also shown.

FIG. 8B shows the X-decoder 700 bias condition for U=0 or V=0, and W=1, which corresponds to an unselected block within a selected group. WL is 0 volts regardless of the value of T_1<#>.

FIG. 8C shows the X-decoder 700 bias condition for W=0, which corresponds to an unselected group. WL is independent of the value of T_1<#>. During the erase mode, WL assumes the value of minus 8 volts. Bias conditions for the read and program modes are also shown.

Figure 9:
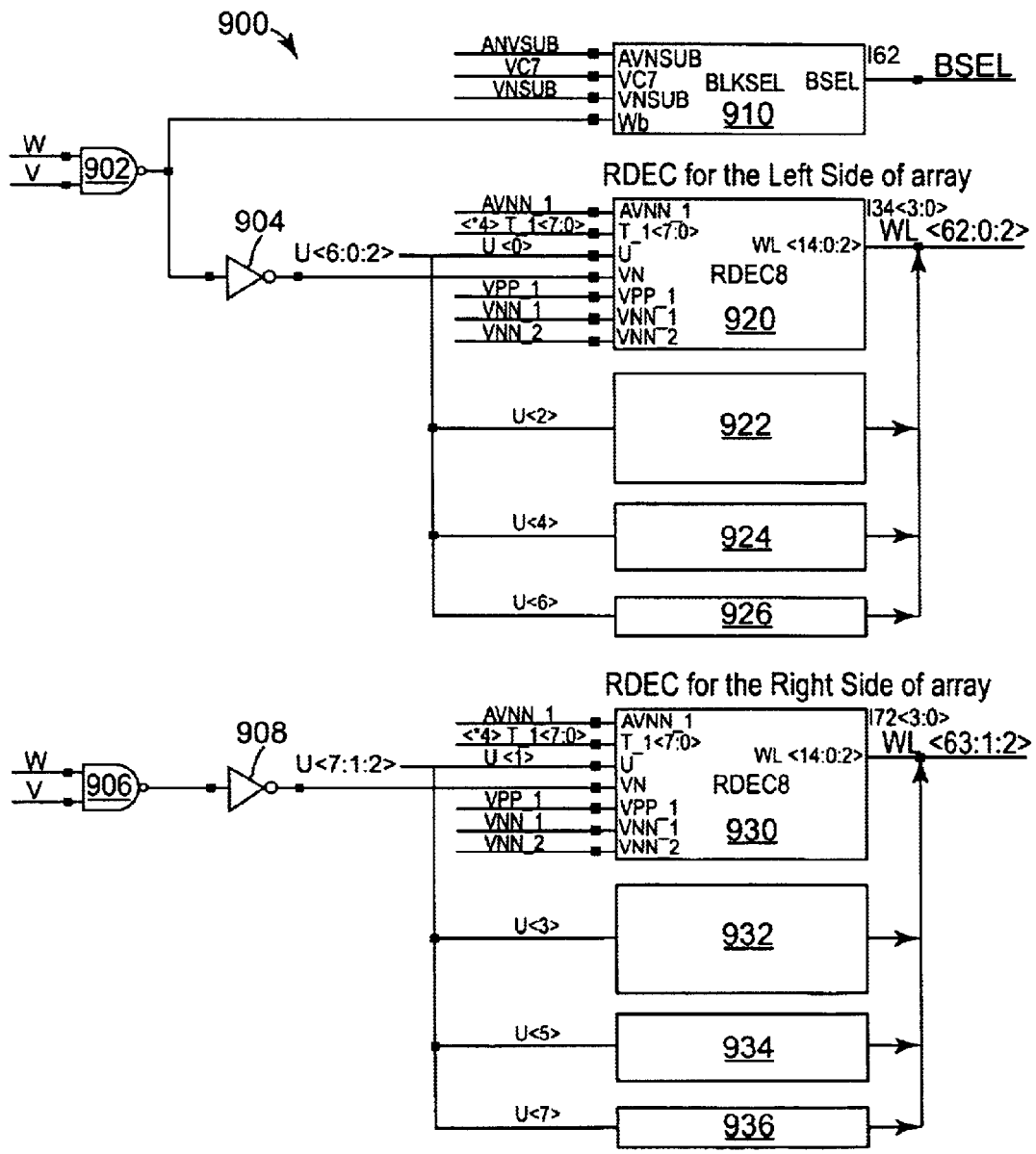
FIG. 9 is a block schematic diagram of multiple X-decoder circuits assembled to obtain a 64 page X-decoder.

FIG. 9 shows how multiple X-decoder circuits identical to the basic X-decoder circuit 700 are assembled to obtain a 64 page X-decoder 900, which is useful for addressing a block having 64 pages. Four X-decoder circuits 920, 922, 924 and 926 are positioned on the left side of the memory array 400 and respectively receive signals U<0>, U<2>, U<4> and U<6> for selecting one of the word lines WL<62:0:2> based on T_1<7:0>, while four X-decoder circuits 930, 932, 934 and 936 are positioned on the right side of the memory array 400 and respectively receive signals U<1 >, U<3>, U<5> and U<7> for selecting one of the word lines WL<63:1:2> based on T_1<7:0>.

Figure 10:
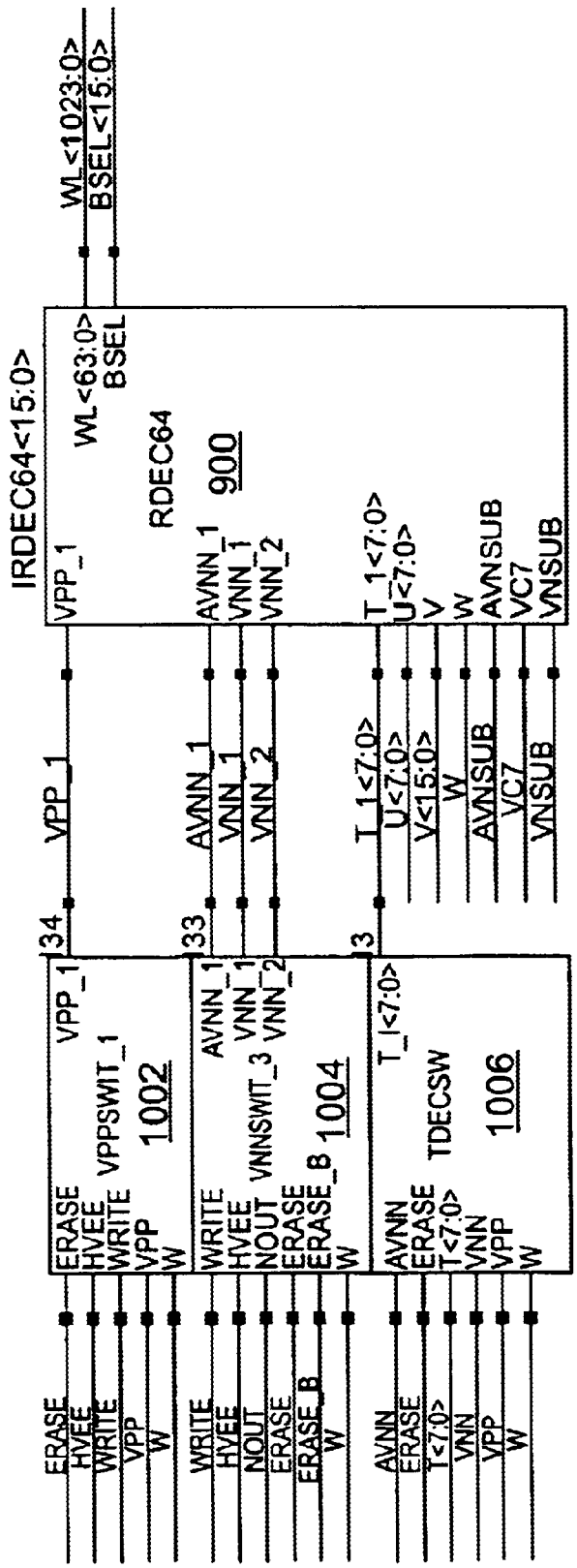
FIG. 10 is a block schematic diagram of VPPSWIT_1 voltage switches, VNNSWIT_3 voltage switches, and TDECSW voltage switches as used with the 64 page X-decoder of FIG. 9.

FIG. 10 shows how various voltage switches are used with the 64 page X-decoder 900. VPPSWIT-1 voltage switches 1002 supplies the output $V_{PP\_1}$, as a function of ERASE, HVEE, WRITE, $V_{PP}$ and W. VNNSWIT_3 voltage switches 1004 supplies the outputs $AV_{NN\_1}$, $V_{NN\_1}$ and $V_{NN\_2}$ as a function of WRITE, HVEE, NOUT, ERASE, ERASE_B and W. TDECSW voltage switches 1006 supplies the outputs T_1<7:0> as a function of $AV_{NN}$, ERASE, T<7:0>, $V_{NN}$, $V_{PP}$ and W. The signal HVEE is generated by a negative voltage detector (not shown), which detects the medium voltage, generally about −4 volts, of NOUT. NOUT is the output of a negative voltage pump (not shown).

Figure 11:
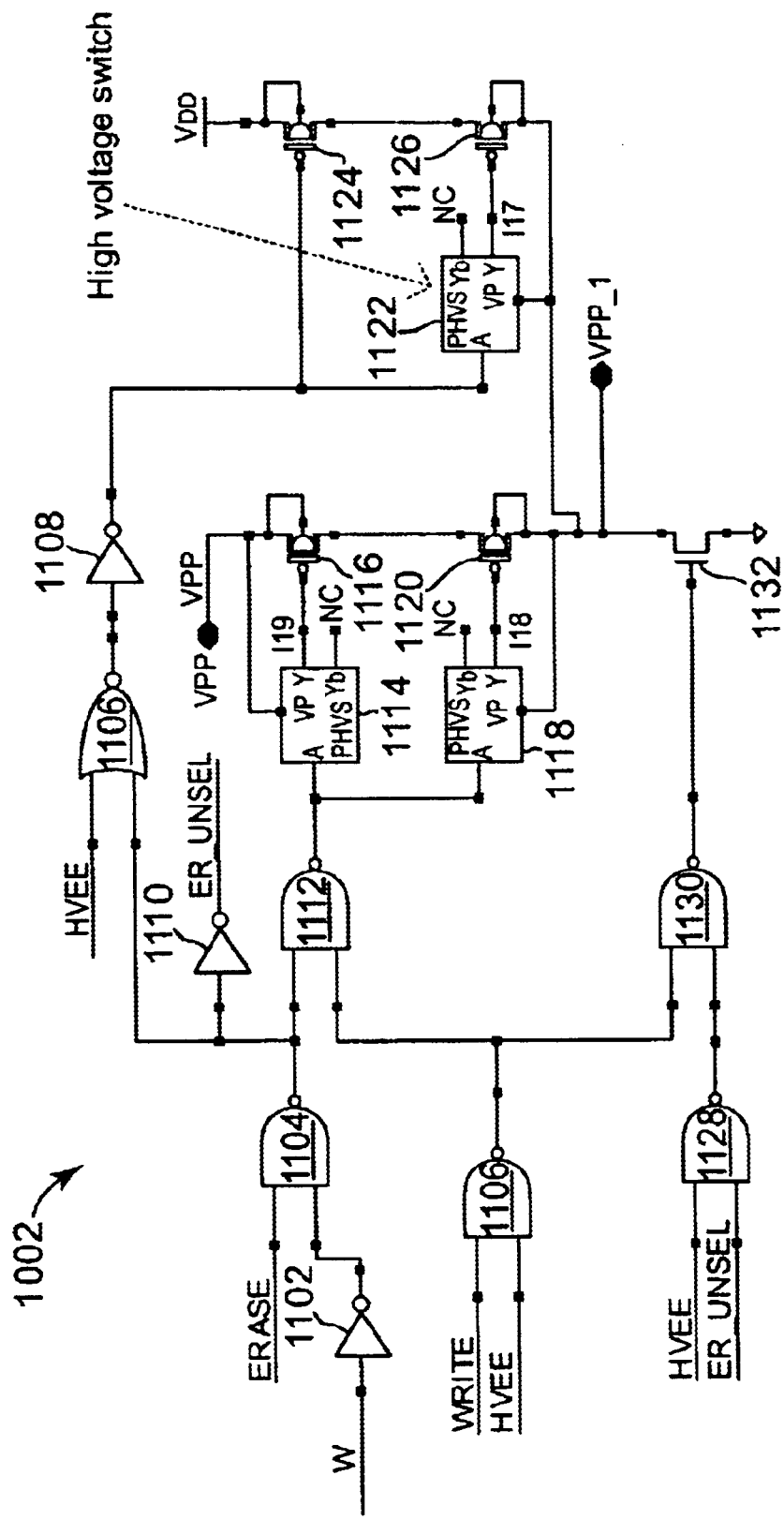
FIG. 11 is a detailed schematic circuit diagram of the VPPSWIT_1 voltage switches of FIG. 10.

FIG. 11 shows the VPPSWIT_1 voltage switches 1002 in greater detail. The signal W is applied to inverter 1102, and the signals ERASE and W complement are applied to NAND gate 1104. The signals WRITE and HVEE are applied to NAND gate 1106. The outputs of NAND gates 1104 and 1106 are applied to NAND gate 1112, the output of which is furnished to high voltage level shifters ("PHVS") 1114 and 1118. P-channel transistors 1116 and 1120 are connected in series, with the control gate of transistor 1116 being connected to the Y output of the high voltage level shifter 1114, and the control gate of transistor 1120 being connected to the Y output of the high voltage level shifter 1118. Voltage $V_{PP}$ is applied to the VP input of the high voltage level shifter 1114 and to the source and substrate of the transistor 1116. Signals HVEE and ER_UNSEL are applied to NAND gate 1130, the output of which is applied to N-channel transistor 1132. The drain of the N-channel transistor 1132 is connected to the drain and the substrate of the transistor 1120 and to the VP input of the high voltage level shifter 1118. The output $V_{PP\_1}$, is taken from the drain of the transistor 1120. The output of the NAND gate 1104 is applied along with signal HVEE to NOR gate 1106, the output of which is inverted in inverter 1108 and applied to high voltage level shifter 1122. P-channel transistors 1124 and 1126 are connected in series with the control gate of transistor 1124 being connected to the output of the inverter 1108, and the control gate of transistor 1126 being connected to the Y output of the high voltage level shifter 1122. Voltage Vcc is applied to the source and substrate of the transistor 1124. The drain of the transistor 1120 also is connected to the VP input of the high voltage level shifter 1122 and to the source and substrate of the transistor 1126.

Advantageously, the voltage switches 1002 provides suitable voltages for the $V_{PP\_1}$ node for the various modes of operation.

FIG. 12, which consists of FIGS. 12A, 12B, 12C, 12D, 12E and 12F, shows the VNNSWIT_3 voltage switches 1004 in greater detail. As shown in FIG. 12A, signal HVEE is inverted by inverter 1200 and supplied as signal VPW. As shown in FIG. 12B, signal W is inverted in inverter 1202 and supplied with signal ERASE to NAND gate 1204, the output of which is inverted in inverter 1206 and supplied as signal ERASESEL. As shown in FIG. 12C, signal W is inverted in inverter 1208 and supplied with signal ERASE_B to NAND gate 1210, the output of which is inverted in inverter 1212 and supplied as signal ERASE_BSEL. As shown in FIG. 12D, signals HVFE and ERASE_BSEL are applied to NAND gate 1214, signals WRITE and ERASESEL are applied to NAND gate 1216, and the outputs of the NAND gates 1214 and 1216 are applied to NOR gate 1218. The output of NOR gate 1218 is applied to the control gates of series-connected p-channel transistor 1220 and n-channel transistor 1222. P-channel transistor 1224 and n-channel transistor 1226 are connected in series, with the node between transistors 1220 and 1222 being connected to the source and substrate of p-channel transistor 1224, the signal $V_{NN\_1}$ being supplied to the source and substrate of the n-channel transistor 1226, and the node between the transistors 1224 and 1226 being supplied as the output signal $AV_{NN\_1}$.

As shown in FIG. 12E, n-channel transistors 1262 and 1264 are connected in series, with the drain of transistor 1262 being connected to ground, the source and substrate of transistor 1262 being connected to the drain of transistor 1264 and being the output signal $V_{NN\_1}$, and the source and substrate of transistor 1264 being the input signal NOUT. The signals WRITE and ERASE_BSEL are applied to NOR gate 1230, the output of which is connected to the source and substrate of p-channel transistor 1232, the substrate of p-channel transistor 1238, and the inverter 1240. The drain of the transistor 1232 is connected to the gate of the transistor 1262, and to the drain of n-channel transistor 1236. The source and substrate of the transistor 1236 are connected to the source of the transistor 1238, the gate of which is grounded and the drain of which is connected to the drain of n-channel transistor 1242. The gate of the transistor 1242 is connected to the output of the inverter 1240, and the source is connected to ground. Signal HVEE is applied to inverter 1234, the output of which is applied to the gate of the transistor 1236 and to NAND gate 1248. Signals WRITE and ERASE_BSEL are applied to NOR gate 1244, the output of which is inverted by inverter 1246 which in turn is applied to the NAND gate 1248. The output of the NAND gate 1248 is inverted in inverter 1250, the output of which is applied to the source and substrate of p-channel transistor 1252. The gate of transistor 1252 is grounded and the drain is connected to the gate of the transistor 1264. A latch includes p-channel transistor 1254 and n-channel transistor 1256 connected by their drains, and p-channel transistor 1258 and n-channel transistor 1260 connected by their drains. The sources and substrates of the transistors 1256 and 1260 are connected, as are the sources and substrates of the transistors 1254 and 1258. Signal VPW is applied to the sources and substrates of the transistors 1254 and 1258 through n-channel transistor 1253, the gate of which is connected to $V_{CC}$. The drains of the transistors 1254 and 1256 are connected to the source and substrate of the transistor 1236 and to the source of the transistor 1238. The drains of the transistors 1258 and 1260 are connected to the gate of the transistor 1264.

As shown in FIG. 12F, n-channel transistors 1296 and 1298 are connected in series, with the drain of transistor 1296 being connected to ground, the source and substrate of transistor 1296 being connected to the drain of transistor 1298 and being the output signal $V_{NN\_2}$, and the source and substrate of transistor 1298 being the input signal NOUT. The signal ERASE_BSEL is applied to inverter 1270, the output of which is connected to the source and substrate of p-channel transistor 1272, the substrate of p-channel transistor 1278, and the inverter 1280. The drain of the transistor 1272 is connected to the gate of the transistor 1296, and to the drain of n-channel transistor 1276. The source and substrate of the transistor 1276 are connected to the source of the transistor 1278, the gate of which is grounded and the drain of which is connected to the drain of n-channel transistor 1282. The gate of the transistor 1282 is connected to the output of the inverter 1280, and the source is connected to ground. Signal HVEE is applied to inverter 1274, the output of which is applied to the gate of the transistor 1276 and to NAND gate 1284. Signal ERASE_BSEL also is applied to the NAND gate 1284, the output of which is inverted by inverter 1286. The output of the inverter 1286 is applied to the source and substrate of p-channel transistor 1288. The gate of transistor 1288 is grounded and the drain is connected to the gate of the transistor 1298. A latch includes p-channel transistor 1291 and n-channel transistor 1292 connected by their drains, and p-channel transistor 1293 and n-channel transistor 1294 connected by their drains. The sources and substrates of the transistors 1292 and 1294 are connected, as are the sources and substrates of the transistors 1291 and 1293. Signal VPW is applied to the sources and substrates of the transistors 1291 and 1293 through n-channel transistor 1290, the gate of which is connected to $V_{CC}$. The drains of the transistors 1291 and 1292 are connected to the source and substrate of the transistor 1276 and to the source of the transistor 1278. The drains of the transistors 1293 and 1294 are connected to the gate of the transistor 1298.

Advantageously, the voltage switches 1004 provides suitable voltages for the $V_{NN\_1}$, $V_{NN\_2}$ and $AV_{NN\_1}$ nodes for the various modes of operation, as shown in FIG. 8A, FIG. 8B and FIG. 8C.

Figure 13:
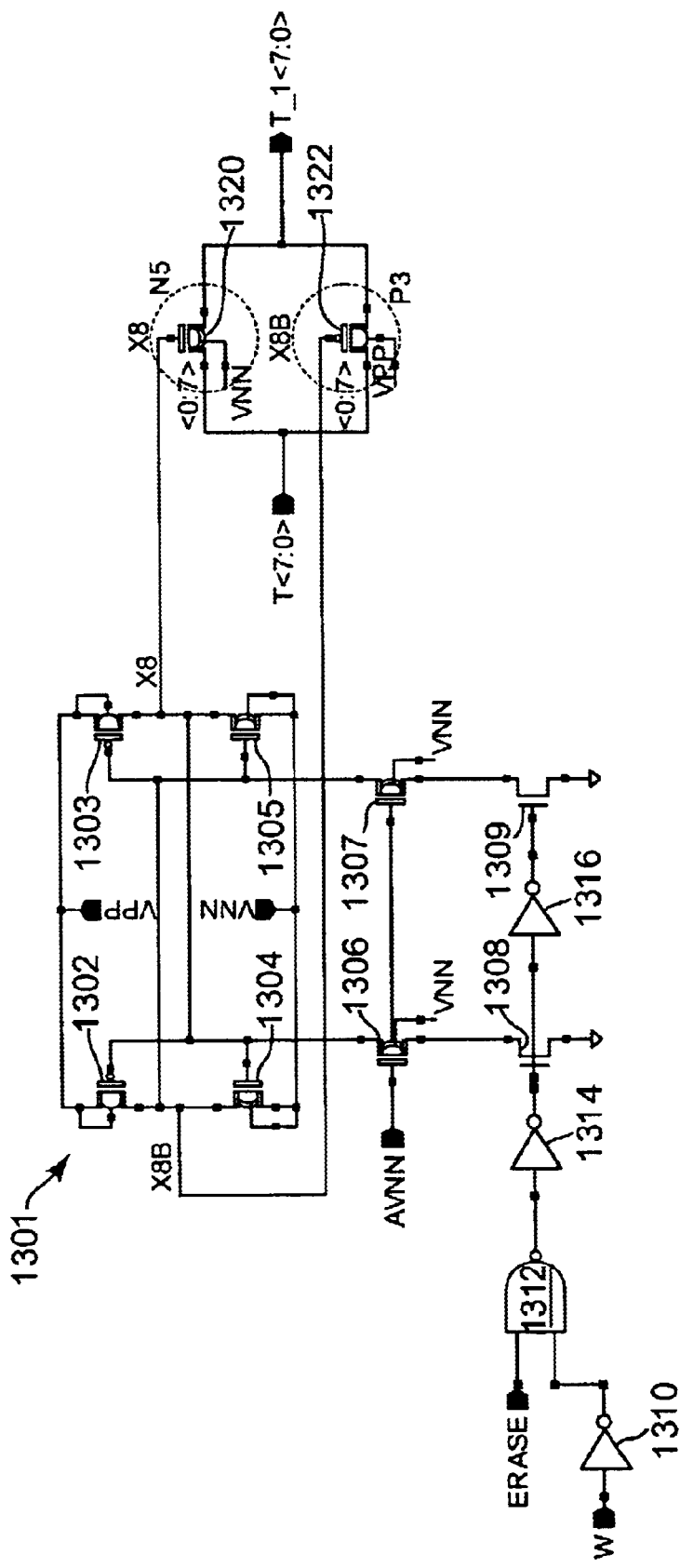
FIG. 13 is a detailed schematic circuit diagram of the TDECSW voltage switches of FIG. 10.

FIG. 13 shows the TDECSW voltage switches 1006 in greater detail. NAND gate 1312 receives signal ERASE and the inverted signal W from the output of inverter 1310, and the output is applied to a latch 1301 for setting the state thereof through either transistor 1308 or transistor 1309 via an inverter 1316. One branch of the latch 1301 includes p-channel transistor 1302 and n-channel transistor 1304, and the other branch of the latch 1301 includes p-channel transistor 1303 and n-channel transistor 1305. The voltage $V_{PP}$ is applied to the p-channel transistors 1302 and 1303, which also have their substrates tied to $V_{PP}$. The voltage $V_{NN}$ is applied to the n-channel transistors 1304 and 1305, which also have their substrates tied to $V_{NN}$. The latch 1301 is enabled by signal $A_{V_{NN}}$ applied to n-channel transistors 1306 and 1307, both of which have their substrates tied to voltage $V_{NN}$. The outputs X8 and X8B of the latch 1301 respectively assume the voltages $V_{PP}$ and $V_{NN}$ or $V_{NN}$ and $V_{PP}$ depending on the value of ERASE and W, as shown in the Table of FIG. 14 (bias conditions for the read and program modes are also shown), and are respectively applied to n-channel transistor 1320 and p-channel transistor 1322. The input T<7:0> is applied to the transistors 1320 and 1322, and the output T_1<7:0> tracks the input T<7:0> during the erase mode when W is high, and floats during the erase mode when W is low, as shown in the Table of FIG. 14.

Advantageously, the voltage switches 1006 provides suitable voltages for the T_1<0:7> nodes for the various modes of operation, as shown in FIG. 14. The voltage switches 1006 prevent the signal T<#> from being applied to the X-decoders for the unselected groups. During erase, at least one of the T<#> signals is at 12 volts (all T<#> are 12 volts in a block erase). If a 12 volt T<#> signal were to reach an X-decoder of an unselected group, it would cause junction-substrate breakdown since the junction would be at 12 volts and the substrate would be at minus 8 volts. Hence, the T_1 is made to float for the unselected groups.

Figure 15:
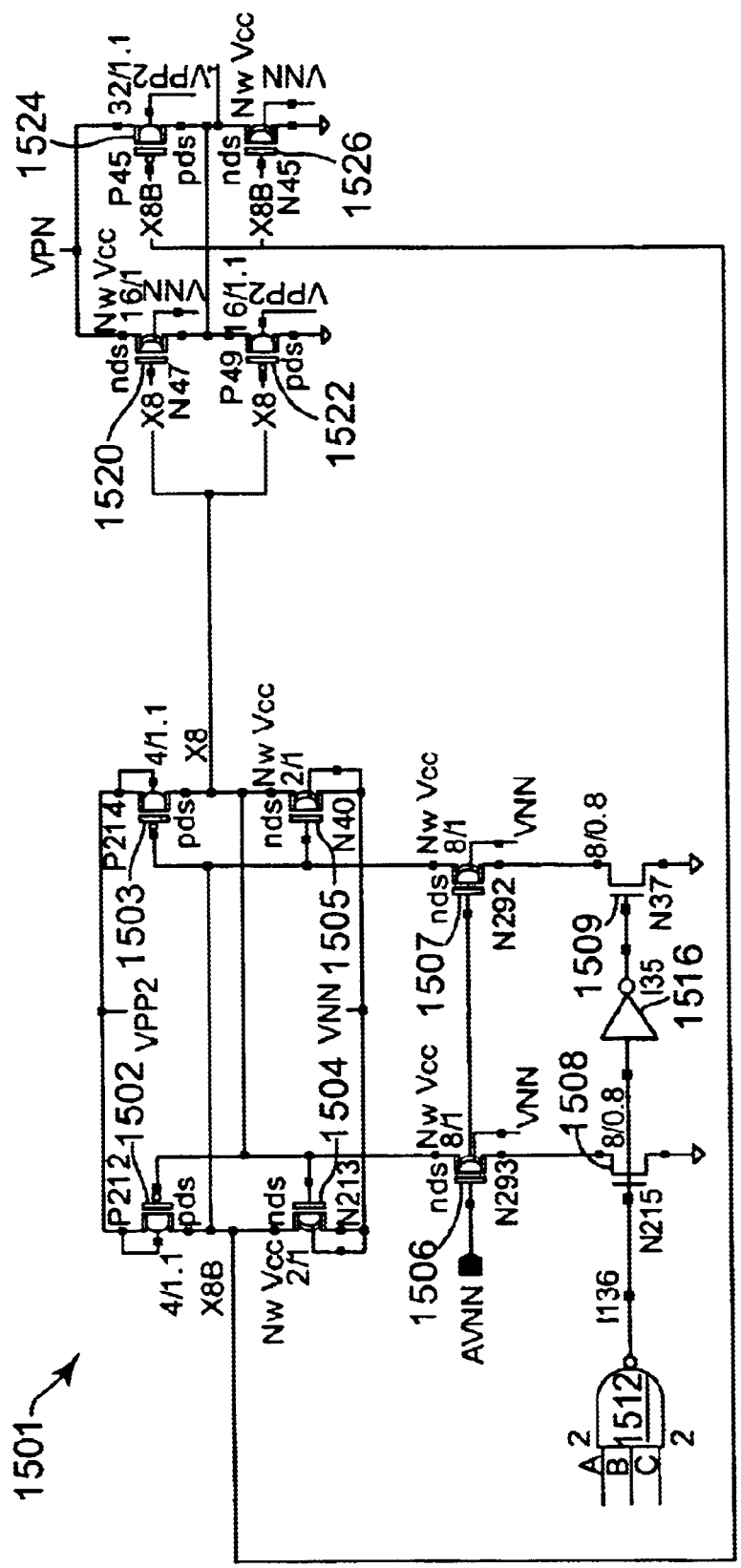
FIG. 15 is a detailed schematic circuit diagram of a TDEC pre-decode circuit.

FIG. 15 shows one of eight essentially identical TDEC pre-decode circuits that produce the global signal T<0:7> from the address signal A<1:3>. The A,B,C inputs to each of the eight varies depending on the T<#> being produced, as follows: for T<7> apply A<3>, A<2> and A<1>; for T<6> apply A<3 >, A<2> and AB<1>; for T<5> apply A<3>, AB<2> and A<1>; for T<4> apply A<3>, AB<2> and AB<1>; for T<3> apply AB<3>, A<2> and A<1>; for T<2> apply AB<3>, A<2> and AB<1>; for T<1> apply AB<3>, AB<2> and A<1>; and for T<0> apply AB<3>, AB<2> and AB<1>. The other inputs are $V_{PN}$ from a suitable voltage generator (not shown) and global signals $V_{NN}$ and $AV_{NN}$ from a suitable voltage switch (not shown).

NAND gate 1512 receives signals A,B,C as described above, and the output is applied to a latch 1501 for setting the state thereof through either transistor 1508 or transistor 1509 via an inverter 1516. One branch of the latch 1501 includes p-channel transistor 1502 and n-channel transistor 1504, and the other branch of the latch 1501 includes p-channel transistor 1503 and n-channel transistor 1505. The voltage $V_{PP}$ is applied to the p-channel transistors 1502 and 1503, which also have their substrates tied to $V_{PP}$. The voltage $V_{NN}$ is applied to the n-channel transistors 1504 and 1505, which also have their substrates tied to $V_{NN}$. The latch 1501 is enabled by signal $A_{VNN}$ applied to n-channel transistors 1506 and 1507, both of which have their substrates tied to voltage $V_{NN}$. The outputs X8 and X8B of the latch 1501 respectively assume the voltages $V_{PP}$ and $V_{NN}$ or $V_{NN}$ and $V_{PP}$ depending on the NAND of A, B and C, as shown in the Table of FIG. 16 (bias conditions for the read and program modes are also shown). The output X8 is applied to n-channel transistor 1520 and p-channel transistor 1522, while the output X8B is applied to p-channel transistor 1524 and n-channel transistor 1526. The n-channel transistor 1520 and the p-channel transistor 1522 are connected in series between VPN and ground, with the common connection node being output T. The p-channel transistor 1524 and the n-channel transistor 1526 also are connected in series between VPN and ground, with the common connection node also being output T.

Figure 17:
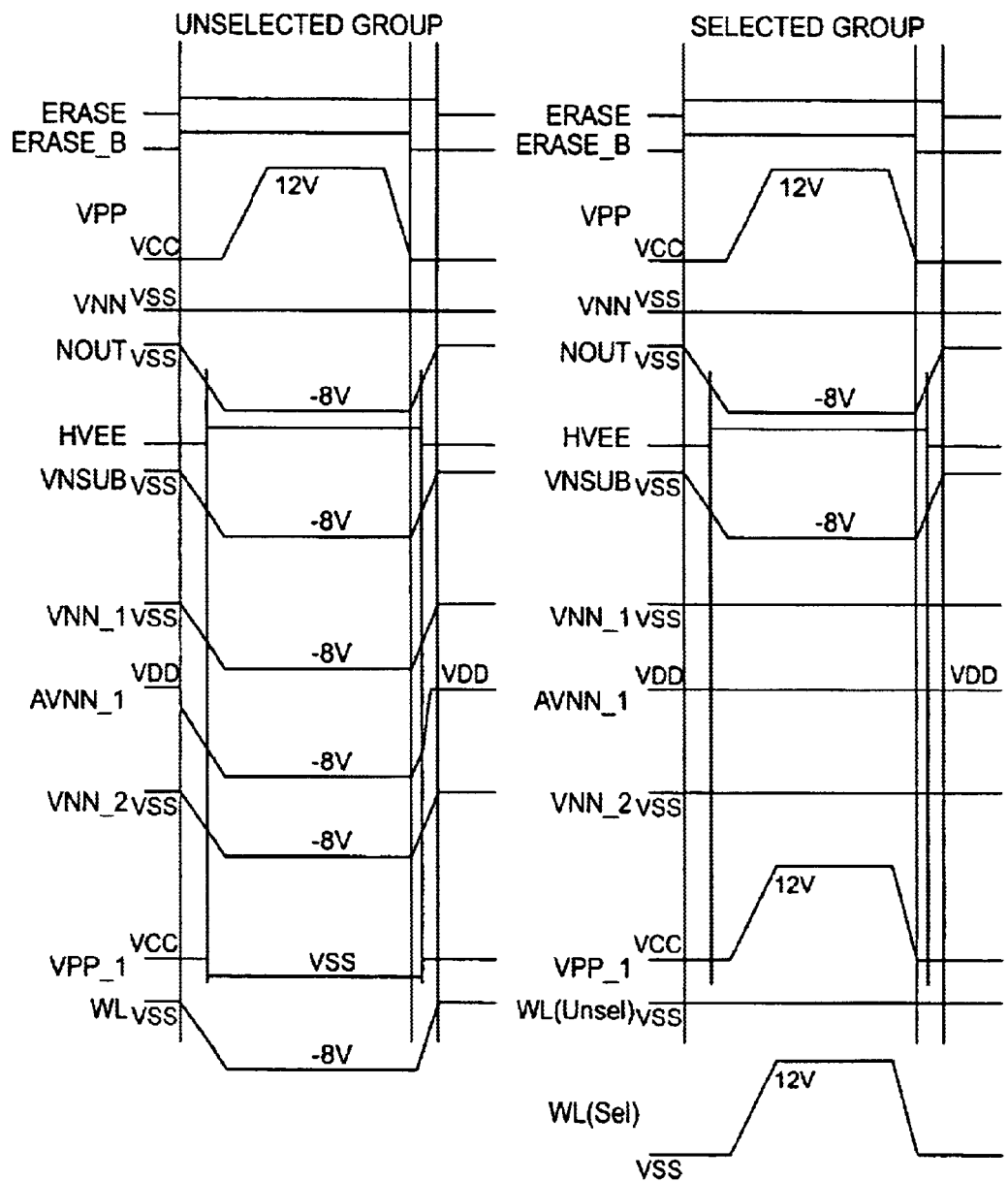
FIG. 17 is a set of graphs showing many of the various signals described herein set on a common time scale, for both unselected groups and the selected group.

FIG. 17 shows many of the various signals described herein set on a common time scale, for both the unselected groups and the selected group. The global signals shown in FIG. 15 are ERASE, ERASE_B, $V_{PP}$, $V_{NN}$, NOUT, HVEE and $V_{NSUB}$. The local signals shown in FIG. 15 are $V_{NN\_1}$, $AV_{NN\_1}$, $V_{NN\_2}$, $V_{PP\_1}$, and WL.

Various circuit designs, device designs, and fabrication processes are known for manufacturing the semiconductor memory of FIG. 4 and variations thereof. It will be appreciated that specific circuits, transistor types and the materials, dimensions, doping concentrations, doses, energy levels, temperatures, drive-in times, ambient conditions, and all other values for the parameters of these processes may well be selected as a matter of design choice or to achieve desired characteristics, as would be understood by one of ordinary skill in the art. As these devices and processes are not specific to the fabrication of the semiconductor memory and are in any event well known in the art, they are not further described herein.

The description of the invention and its applications as set forth herein is illustrative and is not intended to limit the scope of the invention. Variations and modifications of the embodiments disclosed herein are possible, and practical alternatives to and equivalents of the various elements of the embodiments are known to those of ordinary skill in the art. The various components described or referred to herein, such as, for example, multiplexers, bias circuits, line drivers, voltage switches, and positive and negative voltage pumps, may be implemented in a variety of ways, such implementations being well known in the art. Moreover, the various terms used herein are to be given their broadest meaning. The term bit line, for example, is intended to be inclusive of implanted sub-bitlines used for each block as well as metal bit lines that span multiple blocks. The term "page" used herein is sometimes referred to as a "sector." The term "nonvolatile memory cell" refers to a variety of different types of nonvolatile semiconductor memory, including floating gate single transistor cells that use Fowler-Nordheim tunneling for both programming and erasing, or that use hot electrons and Fowler-Nordheim tunneling for programming and erasing respectively. These and other variations and modifications of the embodiments disclosed herein may be made without departing from the scope and spirit of the invention.

What is claimed is:

1. A nonvolatile semiconductor memory array integrated circuit comprising:

an array of nonvolatile memory cells generally organized in a plurality of pages, each page being accessible by a word line and the bits therein being accessible by bit lines;

an address input; and an X-decoder having an input coupled to the address input and an output coupled to the word lines of the nonvolatile memory cell array, the output of the X-decoder logically sectioning the memory cell array into a plurality of groups of blocks of pages, and the X-decoder being responsive to an address on the address input during erase mode for selecting one of the groups and one of the blocks within the selected group and for applying a first voltage to at least one page of the selected block in the selected group for erasing the memory cells thereof, a second voltage to the pages of the selected group other than the selected at least one page to avoid erasing the memory cells thereof, and a third voltage to the pages of the groups other than the selected group to avoid disturb of the memory cells thereof.

2. The nonvolatile semiconductor memory array integrated circuit of claim 1 wherein the pages of the memory cell array are organized in a plurality of blocks, each block being selectable by a block select line; and wherein the X-decoder comprises:

a plurality of X-decoder group circuits, each having a plurality of block select outputs and word line outputs coupled to a group of the block select lines and word lines of the memory cell array;

a plurality of voltage switches respectively coupled to the X-decoder group circuits by respective first and second voltage outputs; and a pre-decoder having an input coupled to the address input, global group select outputs, global block select outputs, and global page select outputs;

wherein the X-decoder group circuits are respectively coupled to the global group select outputs of the pre-decoder;

wherein each of the X-decoder group circuits is coupled to the global block select outputs of the pre-decoder; and wherein the voltage switches are respectively coupled to the global group select outputs of the pre-decoder for furnishing a large positive potential on the first voltage output and a ground potential on the second voltage output for the selected group, and for furnishing the ground potential on the first voltage output and a large negative potential on the second voltage output for the unselected group.

3. The nonvolatile semiconductor memory array integrated circuit of claim 2 wherein:

the pre-decoder further has a global page select output;

the voltage switches are coupled to a first subset of the global page select outputs; and the X-decoder group circuits are coupled to a second subset of the global page select outputs different from the first subset of the global page select outputs.

4. A nonvolatile semiconductor memory array integrated circuit comprising:

an array of nonvolatile memory cells generally organized in a plurality of blocks having a plurality of pages, each block being selectable by a block select line and each page being selectable by a word line;

a plurality of X-decoder group circuits, each having a plurality of block select outputs and word line outputs coupled to a group of the block select lines and word lines of the memory cell array;

a plurality of voltage switches respectively coupled to the X-decoder group circuits by respective first and second voltage outputs; and a pre-decoder having an X-address input, global group select outputs, global block select outputs, and global page select outputs;

wherein the X-decoder group circuits are respectively coupled to the global group select outputs of the pre-decoder;

wherein each of the X-decoder group circuits is coupled to the global block select outputs of the pre-decoder; and wherein the voltage switches are respectively coupled to the global group select outputs of the pre-decoder for furnishing a large positive potential on the first voltage output and a ground potential on the second voltage output for a selected group, and for furnishing a ground potential on the first voltage output and a large negative potential on the second voltage output for an unselected group.

5. The nonvolatile semiconductor memory array integrated circuit of claim 4 wherein:

the pre-decoder further has a global page select output;

the voltage switches are coupled to a first subset of the global page select outputs; and the X-decoder group circuits are coupled to a second subset of the global page select outputs different from the first subset of the global page select outputs.

6. A method for operating a nonvolatile semiconductor memory array integrated circuit in a block erase mode, the memory array having an array of nonvolatile memory cells generally organized in a plurality of pages, with each page being accessible by a word line and the bits therein being accessible by bit lines, the method comprising:

logically sectioning the memory cell array into a plurality of groups of blocks of pages;

selecting one of the groups and one of the blocks within the selected group in accordance with a portion of an X memory address;

applying a first voltage on the pages in the selected block of the selected group for erasing the memory cells thereof;

applying a second voltage on the pages in unselected blocks of the selected group to avoid erasing the memory cells thereof; and applying a third voltage on the pages in the groups other than the selected group to avoid disturb of the memory cells thereof.

7. The method of claim 6 wherein:

the pages of the memory cell array arc organized in a plurality of blocks, each block being selectable by a block select line;

the logically sectioning step comprises controlling respective groups of the block select lines and word lines of the memory cell array from a plurality of X-decoder group circuits;

and the selecting step comprises:

respectively furnishing a plurality of global group select signals to the X-decoder group circuits; and furnishing a plurality of global block select signals to each of the X-decoder group circuits.

8. The method of claim 6 wherein the first voltage is a negative voltage to achieve bulk erasure.

9. The method of claim 8 wherein:

the first voltage is about minus 8 volts;

the second voltage is about 0 volts; and the third voltage is about positive 12 volts.

10. The method of claim 6 wherein the first voltage is a positive voltage to achieve channel erasure.

11. The method of claim 10 wherein:

the first voltage is about positive 12 volts;

the second voltage is about 0 volts; and the third voltage is about minus 8 volts.

12. A method for operating a nonvolatile semiconductor memory array integrated circuit in a page erase mode, the memory array having an array of nonvolatile memory cells generally organized in a plurality of pages, with each page being accessible by a word line and the bits therein being accessible by bit lines, the method comprising:

logically sectioning the memory cell array into a plurality of groups of blocks of pages;

selecting one of the groups and one of the blocks within the selected group in accordance with a first portion of an X memory address;

selecting one of the pages within the selected block of the selected group in accordance with a second portion of the X memory address;

applying a first voltage on the selected page of the selected block of the selected group for erasing the memory cells thereof;

applying a second voltage on unselected pages of the selected block of the selected group for erasing the memory cells thereof;

applying the second voltage on the pages in unselected blocks of the selected group to avoid erasing the memory cells thereof; and applying a third voltage on the pages in the groups other than the selected group to avoid disturb of the memory cells thereof.

13. The method of claim 12 wherein:

the pages of the memory cell array are organized in a plurality of blocks, each block being selectable by a block select line;

the logically sectioning step comprises controlling respective groups of the block select lines and word lines of the memory cell array from a plurality of X-decoder group circuits;

the group and block selecting step comprises:
respectively furnishing a plurality of global group select signals to the X-decoder group circuits; and
furnishing a plurality of global block select signals to each of the X-decoder group circuits; and
the page selecting step comprises furnishing a plurality of global page select signals to each of the X-decoder group circuits.

14. The method of claim 12 wherein the first voltage is a negative voltage to achieve bulk erasure.

15. The method of claim 14 wherein:
the first voltage is about minus 8 volts;
the second voltage is about 0 volts; and
the third voltage is about positive 12 volts.

16. The method of claim 12 wherein the first voltage is a positive voltage to achieve channel erasure.

17. The method of claim 16 wherein:
the first voltage is about positive 12 volts;
the second voltage is about 0 volts; and
the third voltage is about minus 8 volts.

* * * * *